US010861398B2

(12) United States Patent
El-Ghoroury

(10) Patent No.: US 10,861,398 B2
(45) Date of Patent: Dec. 8, 2020

(54) QUANTUM PHOTONIC IMAGER INCORPORATING COLOR-TUNABLE SOLID STATE LIGHT EMITTING MICRO PIXELS

(71) Applicant: Ostendo Technologies, Inc., Carlsbad, CA (US)

(72) Inventor: Hussein S. El-Ghoroury, Carlsbad, CA (US)

(73) Assignee: Ostendo Technologies, Inc., Carlsbad, CA (US)

(*) Notice: Subject to any disclaimer, the term of this patent is extended or adjusted under 35 U.S.C. 154(b) by 0 days.

(21) Appl. No.: 16/398,048

(22) Filed: Apr. 29, 2019

(65) Prior Publication Data
US 2019/0333455 A1 Oct. 31, 2019

Related U.S. Application Data

(60) Provisional application No. 62/664,714, filed on Apr. 30, 2018.

(51) Int. Cl.
*G09G 3/34* (2006.01)
*H04N 9/31* (2006.01)
*H01L 33/06* (2010.01)
*H01L 33/08* (2010.01)

(52) U.S. Cl.
CPC ............ *G09G 3/3413* (2013.01); *H01L 33/06* (2013.01); *H01L 33/08* (2013.01); *H04N 9/3182* (2013.01); *G09G 2340/06* (2013.01)

(58) Field of Classification Search
CPC ....... G09G 3/3413; H01L 33/06; H01L 33/08; H04N 9/3182
See application file for complete search history.

(56) References Cited

U.S. PATENT DOCUMENTS

| 7,462,873 | B2* | 12/2008 | Hoshi | H01S 5/426 257/88 |
| 7,901,088 | B2* | 3/2011 | Nakamura | H04N 9/31 345/55 |
| 2005/0057176 | A1* | 3/2005 | Lu | H01L 27/322 315/169.3 |
| 2011/0156616 | A1* | 6/2011 | Anderson | B41J 2/45 315/312 |
| 2013/0214251 | A1* | 8/2013 | Balkenende | H01L 33/04 257/13 |
| 2016/0359084 | A1* | 12/2016 | El-Ghoroury | H01L 33/32 |

* cited by examiner

*Primary Examiner* — Kenneth B Lee, Jr.
(74) *Attorney, Agent, or Firm* — W. Eric Boyd, Esq.

(57) ABSTRACT

An emissive quantum photonic imager comprised of a spatial array of digitally addressable multicolor micro pixels. Each pixel is an emissive micro optical cavity comprising a monolithic color-tunable semiconductor light emitting diode. The light generated by each color-tunable pixel diode is emitted perpendicularly to the plane of the imager directly or via a plurality of vertical waveguides that extract and collimate the light generated from the pixel diode. Each pixel diode is individually addressable to enable the pixel to emit any of the colors associated with its monolithic color-tunable semiconductor light emitting diode at any on/off duty cycle for each color. The individual pixels modulate their required colors and brightness values by controlling the drive current and/or on/off duty cycle of the respective color-tunable diodes. Pixel-level micro optics further collimate and directionally modulate the light emitted from the micro pixels.

34 Claims, 22 Drawing Sheets

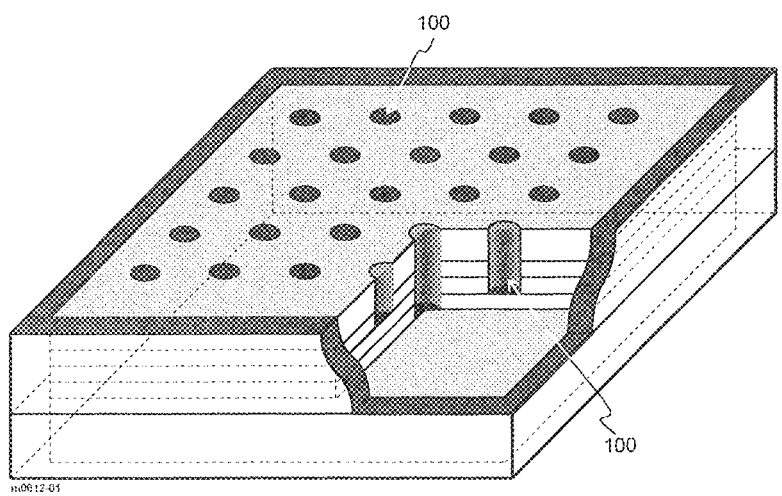
FIG. 1 - Prior Art

300

| 332 | Barrier Layer |
| --- | --- |
| 331R | Red Emitting Sub-Region |
| 332 | Barrier Layer |
| 333-1 | Intermediate Blocking Layer (IBL1) |
| 332 | Barrier Layer |
| 331G | Green Emitting Sub-Region |
| 332 | Barrier Layer |
| 333-2 | Intermediate Blocking Layer (IBL2) |
| 332 | Barrier Layer |
| 331B | Blue Emitting Sub-Region |
| 332 | Barrier Layer |

| P-Doped Layer | 320 |
| --- | --- |
| EBL | 340 |
| MQW Active Regions | 330 |
| N-Doped Layer | 310 |
| Buffer Layer | 312 |
| Substrate | 311 |

FIG. 3D

QUANTUM PHOTONIC IMAGER INCORPORATING COLOR-TUNABLE SOLID STATE LIGHT EMITTING MICRO PIXELS

CROSS REFERENCE TO RELATED APPLICATIONS

This application claims the benefit of U.S. Provisional Application No. 62/664,714 filed on Apr. 30, 2018, the disclosure of which is incorporated herein by reference.

TECHNICAL FIELD

The present disclosure relates to emissive light modulator devices comprising arrays of monolithic semiconductor multicolor solid state light micro pixel emitters that can be used as image sources in digital display systems.

BACKGROUND

The advent of mobile digital media has created significant demand for digital displays that provide the primary interface between a mobile device and its user. The ubiquitous dependence on direct view displays used in mobile devices such as mobile smart phones has generated demand for increased display brightness, reduced power consumption and higher display resolution. Emerging wearable mobile devices, such as smart watches and near-eye augmented and virtual reality (AR/VR) devices, have created further increased demand for improved display resolution combined with reduced power consumption.

Several display technologies have attempted to address the above demand including low temperature poly-silicon liquid crystal displays (LTPS-LCD), organic light emitting diodes (OLED), laser beam scanning (LBS), quantum dots (QDD), and micro LEDs (MLED). However, each of these technologies has certain limitations that prevent them from being an optimal display that meets the stringent, and often conflicting, demands of emerging mobile digital media devices.

For example: (1) although LTPS-LCD offers higher resolution than current LCD displays, this technology still suffers from low brightness and high power consumption characteristic to LCDs; (2) OLED has the potential to offer higher display resolution, but it's brightness is meager, particularly for daylight applications; (3) LBS has eye safety issues when it's peak/average brightness exceeds laser safety limits; (4) QDD has the same limitation as LCD since it is merely a substitute color filter technology; and; (5) MLED suffers from spatial color multiplexing issues that limit its resolution.

Of particular interest in the field of this disclosure is a display referred to as a "Quantum Photonic Imager" display ("QPI® imager", QPI is a registered trademark of Ostendo Technologies, Inc., see U.S. Pat. Nos. 7,623,560, 7,767,479 and 7,829,902). With the micro-scale pixels and power efficiency of the QPI imager, it is able to address the high resolution and low power consumption concerns associated with emerging digital mobile media devices. In order to ensure the market potential of the QPI imager, it would be beneficial to reduce the cost of QPI imager manufacturing. Although the cost of solid state light emitting (photonic) material used in manufacturing the current QPI imager has dropped considerably during the past five years, such photonic material costs still constitute a major portion of the current QPI imager's total manufacturing bill of materials ("BOM") such that the future market potential of the QPI imager is better assured if such costs could be further reduced.

U. S. Patent Application Publ. No. 2016/0359300, "Growth of Monolithic Full-Color GaN-based LED with Intermediate Carrier Blocking Layers", H. S. El-Ghoroury et al., AIP Advances 6, 075316 (2016), and "The World First Monolithic Full-Color LED", J-C Chin et al. Compound Semiconductors, vol. 22, Issue 8, November-December 2016, describe a prior art multi-color solid state light emitting monolithic III-V material and structure with a light emission color can be controlled by a charge carrier injection current level. The use of this type of multi-color solid state light emitting monolithic III-V material as the photonic material for the QPI imager offers the opportunity to reduce QPI imager photonic material and manufacturing costs. Such a cost reduction stems from requiring only a single photonic layer of the multi-color solid state light emitting monolithic III-V material instead of three separate bonded photonic layers each emitting a different color that are used in the current QPI imager.

Additionally, by reducing the number of electrical contacts required for the control of each pixel in a QPI imager, the use of this type of multi-color solid state light emitting monolithic III-V material as the photonic material offers the opportunity to further reduce the QPI imager pixel size, thus increasing its resolution.

It is therefore an aspect of this disclosure to disclose a device and methods for the operation, manufacturing and applications of QPI imagers that make use of tunable multi-color solid state light emitting monolithic III-V material to take advantage of the numerous benefits the material enables. Additional aspects and advantages of this disclosure will become apparent from the following detailed description of various embodiments thereof that proceeds with reference to the accompanying drawings.

BRIEF DESCRIPTION OF THE DRAWINGS

The disclosure is illustrated by way of example, and not by way of limitation, in the figures in the accompanying drawings in which like reference numerals refer to similar elements.

FIG. 1 illustrates a prior art Quantum Photonic Imager device that uses three separate light emitting layers in each pixel to generate the micro pixel primary colors.

FIG. 3D illustrates a cross-sectional view of the semiconductor photonic structure that forms the pixels of the color-tunable multicolor Monolithic Quantum Photonic Imager device of this disclosure.

DETAILED DESCRIPTION

References in the following detailed description of the present disclosure to "one embodiment" or "an embodiment" means that a particular feature, structure, or characteristics described in connection with the embodiment is included in at least one embodiment of the disclosure. The appearances of the phrase "in one embodiment" in various places in this detailed description are not necessarily all referring to the same embodiment.

FIG. 1 illustrates a prior art Quantum Photonic Imager device 1 that uses three separate and bonded light emitting layers in each pixel 100 to generate the micro pixel primary colors from pixels 100.

A monolithic, multicolor emissive imager is disclosed herein. In the following description, for the purpose of explanation, numerous specific details are set forth in order to provide an understanding of the disclosure. It will be apparent, however, to one skilled in the art of semiconductors that the disclosure can be practiced with different specific details. In other instances, structures and devices may be shown in block diagram form in order to avoid obscuring the disclosure.

Monolithic QPI Imager Architecture

Figure 2A:
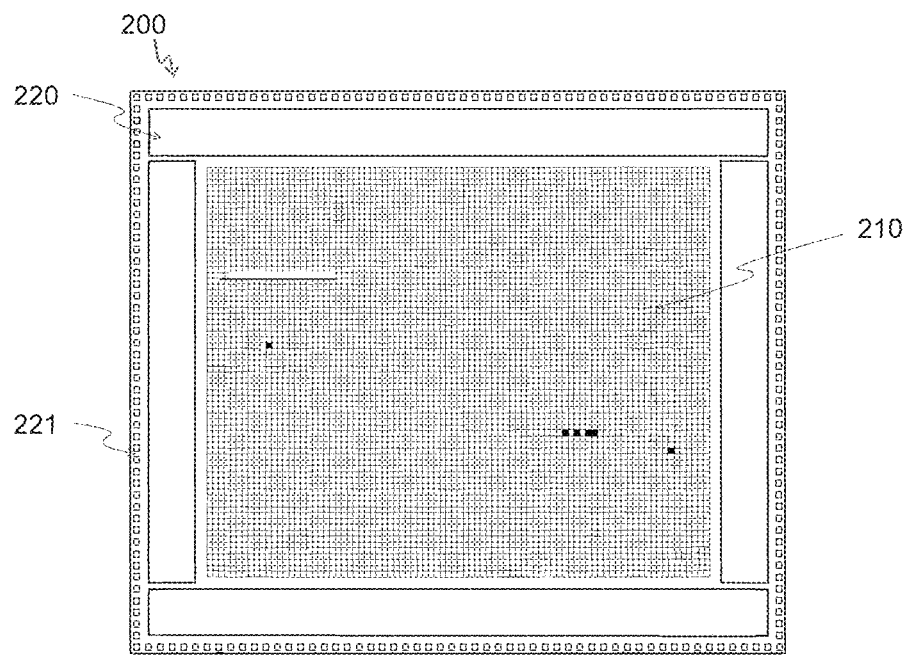
FIG. 2A illustrates a plan view of the Monolithic Quantum Photonic Imager device of this disclosure that uses a single color-tunable light emitting layer to generate the micro pixel addressable colors.
Figure 2B:
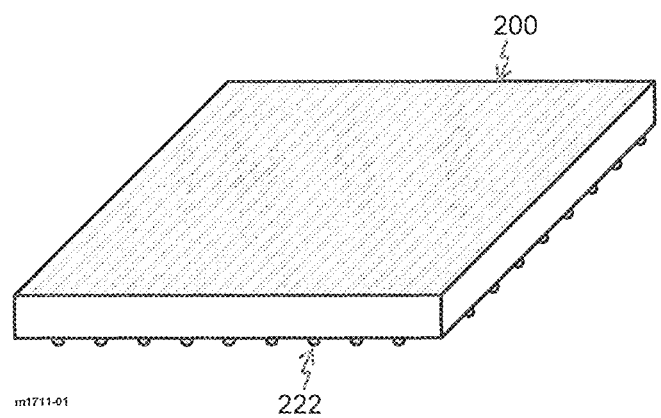
FIG. 2B illustrates an isometric view of the Monolithic Quantum Photonic Imager device of this disclosure having its micro pixel array reaching the lateral edges of the device.

The disclosed emissive multicolor digital image imager of FIG. 2A and FIG. 2B described herein, referred to as a "Monolithic Quantum Photonic Imager" device or "M-QPI" imager 200 for abbreviation, is a semiconductor device comprising an array of monolithic color-tunable solid state light emitting photonic structures also referred to as pixels or micro pixels 210 herein. The M-QPI imager 200 of this disclosure is comprised of a plurality of emissive micro pixels 210 whereby each pixel 210 comprises an electrically color-tunable solid state light emitting diode. The surface area defined by the emissive color-tunable micro pixels 210 of the emissive pixel 2-D array constitutes the emissive optical aperture of the M-QPI imager 200.

As described in greater detail below, M-QPI imager 200 pixels 210 are typically micro scale multicolor solid state light emitters with a dimensional pixel pitch in the range of five microns (or smaller depending on the semiconductor bonding technique used) or larger as required by the intended application. Each of the plurality of pixels' 210 color-tunable solid state light emitting diodes are optically and electrically separated by sidewalls comprised of an insulating semiconductor material and a reflective metal cladding. Each of the plurality of pixels' 210 color-tunable solid state light emitting diodes has a uniquely addressable contact and a common metal contact, which common metal contact is shared among all or a plurality of the array of pixels 210. Both metal contacts are preferably optically reflective. The reflective metal cladding of the pixel sidewalls, together with the pixel reflective contacts, form the respective M-QPI imager 200 micro pixels' 210 optical cavities.

The multicolor light of each of pixels 210 is emitted perpendicularly to the surface plane of the M-QPI imager 200 optical aperture either directly through the optical aperture surface or through a plurality of vertical waveguides that are optically coupled to the pixel's 210 optical cavity. In addition to the optical and electrical separation functions of the M-QPI imager 200 pixel sidewalls, the metal cladding of the sidewalls is used as an electrical interconnect (or via) that routes electrical current to the constituent electrically-tunable multicolor solid state light emitting diode of each pixel 210.

Each of the plurality of pixels 210 that comprise M-QPI imager 200 is electrically coupled to a control logic circuit that routes an electric current signal that independently controls the color emission of its respective multicolor solid state light emitting diode. The drive logic circuits associated with the plurality of M-QPI imager pixels 210 form a drive logic array that is bonded to the multicolor solid state light emitting pixel array to form a monolithic array of color-tunable pixels and integrated drive circuitry.

FIGS. 2A-2G illustrate various embodiments of the M-QPI imager 200 of this disclosure. FIG. 2A illustrates a plan view of the M-QPI imager 200 of this disclosure that uses a single color-tunable light emitting layer to generate the micro pixel's addressable colors.

FIG. 2B illustrates an isometric view of an alternate configuration of the M-QPI imager 200 of this disclosure having its micro pixel array reaching the optical aperture edge of the imager. The minimal edge configuration of the M-QPI imager 200 of FIG. 2B enables the tiling of multiple M-QPI imagers 200 with minimal gaps between their emissive micro pixel arrays. Such a capability enables the expansion of the micro pixel array size to achieve a higher overall pixel count using a multiplicity of the M-QPI imagers 200 to match the intended application.

Figure 2C:
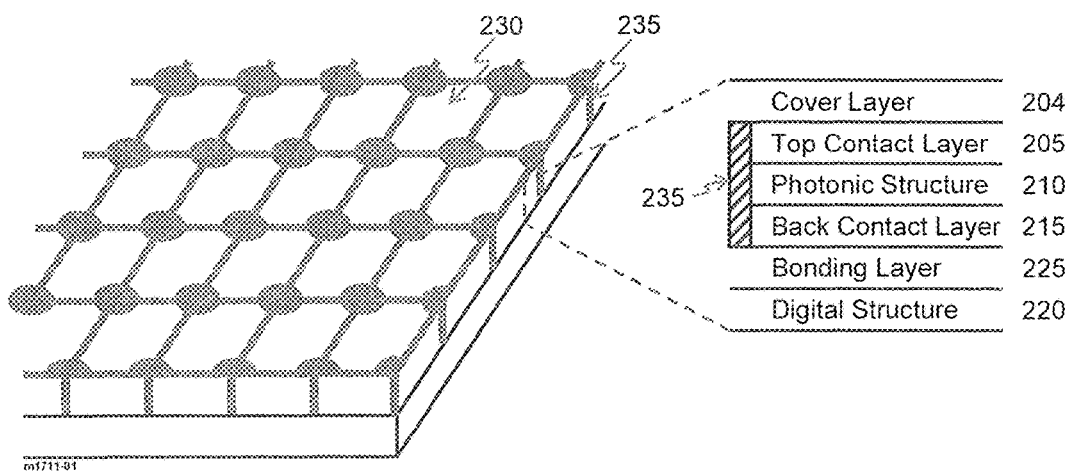
FIG. 2C illustrates a cutaway isometric view of the color-tunable multicolor pixels and the cross-sectional layers of the color-tunable pixel comprising the Monolithic Quantum Photonic Imager device of this disclosure.

FIG. 2C illustrates a cutaway isometric view of the M-QPI imager 200 constituent pixels 230 and illustrates a cross-section of the pixels' 230 constituent layers and sidewall 235.

Figure 2D:
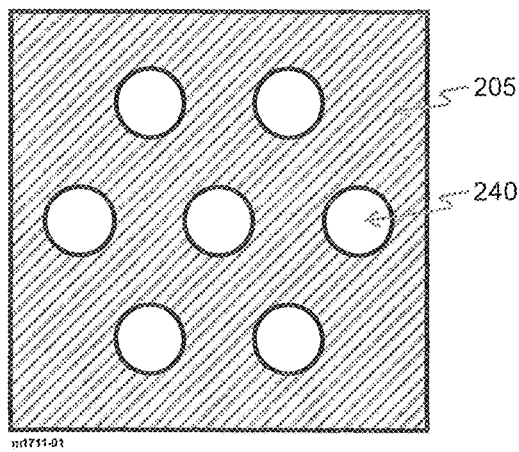
FIG. 2D illustrates a plan view of the emissive surface of a single micro pixel of the color-tunable Monolithic Quantum Photonic Imager device of this disclosure incorporating a multiplicity of waveguides for collimation of the micro pixel light emission.

FIG. 2D is a plan view illustration that shows the pixels' 230 emissive aperture comprised of a multiplicity of optical waveguide apertures 240.

Figure 2E:
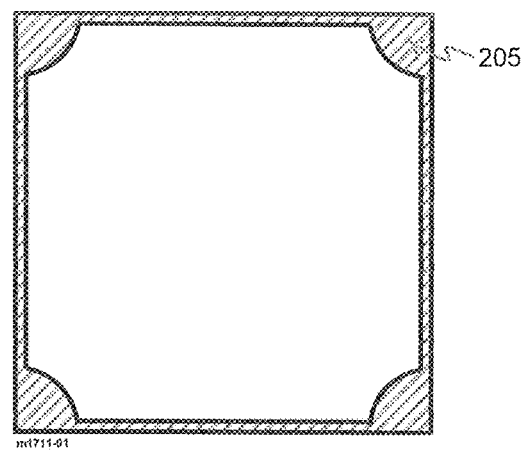
FIG. 2E illustrates a plan view of a single micro pixel of the color-tunable multicolor Monolithic Quantum Photonic Imager device of this disclosure having a substantially Lambertian light emission from the micro pixel.

FIG. 2E is a plan view illustration that shows the pixels' 230 emissive aperture being substantially the entire top side or surface area of the pixels 230 excluding the areas of the pixels' top side contact metal. When the pixels' 230 emissive aperture is substantially the entirety of the pixel's top side area as illustrated in FIG. 2E, the pixel 230 light emission is substantially Lambertian.

Figure 2F:
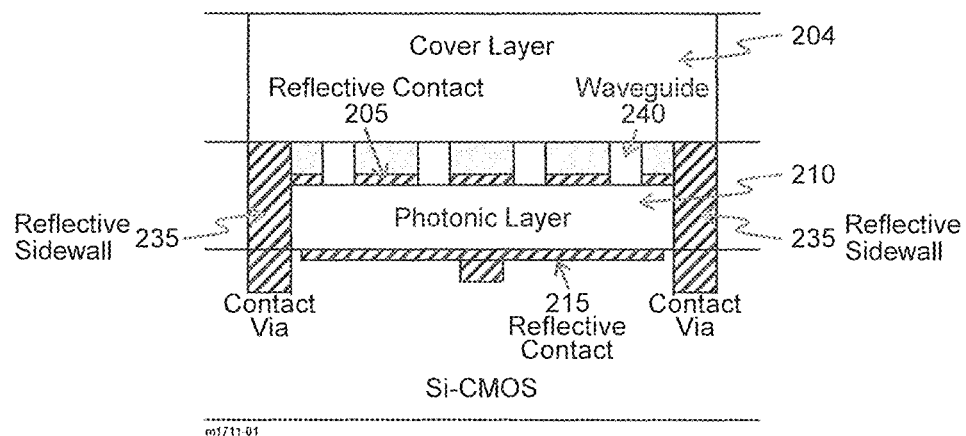
FIG. 2F illustrates a cross-sectional view of a single micro pixel of the color-tunable multicolor Monolithic Quantum Photonic Imager device of this disclosure having a quasi-Lambertian light emission from the micro pixel.

FIG. 2F illustrates a cross-sectional view of a single micro pixel of the color-tunable M-QPI imager 200 with pixel's 230 light emission being through the pixel's top side waveguides 240 having a depth, diameter and pattern across the pixel's 230 aperture to generate a quasi-Lambertian light emission from the micro pixel.

Referring to FIG. 2F, the pixel 230 top side waveguides' 240 depth, diameter and pattern across the pixels' 230 aperture's can be selected to adjust the pixels' 230 light emission angular width within a range from about 15° to about 45°. As such, the pixels' 230 top side waveguides' 240 design parameters can be selected to collimate the light emitted from the pixels 230.

The pixels' 230 light emission angular width or collimation angle, being a design parameter of the pixels 230, enables numerous applications of the M-QPI imager 200 where the collimation angle of the imager's light emission is of importance; for example, when coupling into external waveguide optics (such as is common in near-eye displays) or for the efficient optical coupling into projection optics. Without such emitted light collimation capabilities, the light emitted from a typical Lambertian imager is wasted to vignetting when coupled into waveguide optics or projection optics. As disclosed, the emitted light collimation capabilities of the M-QPI imager 200 make it an optically efficient color-tunable display.

Figure 2G:
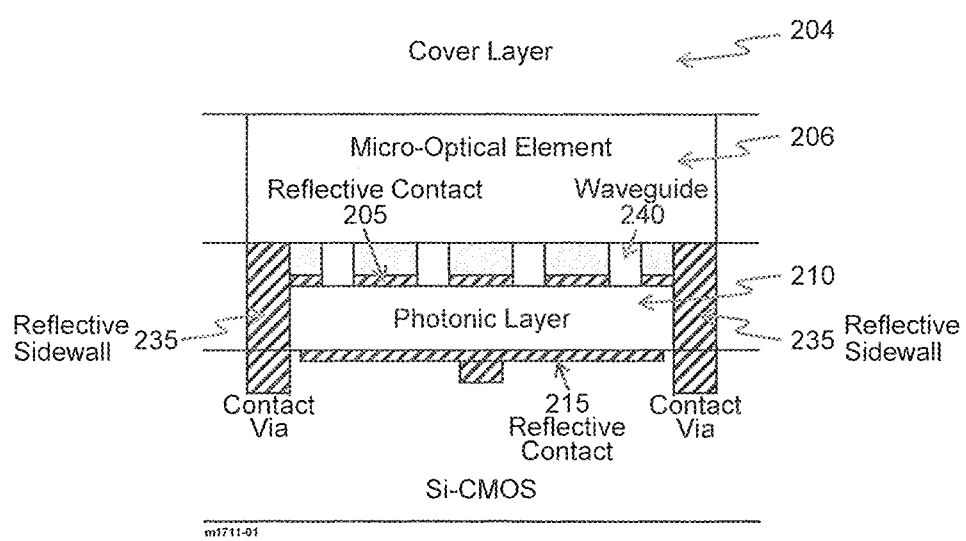
FIG. 2G illustrates a cross-sectional view of the micro pixel comprising the color-tunable Monolithic Quantum Photonic Imager device of this disclosure incorporating a pixel-level micro optical element for collimation and directional modulation of the micro pixel light emission.

FIG. 2G illustrates a cross-sectional view of a single micro pixel of the color-tunable M-QPI imager 200 with the pixel's 230 light emission being coupled through the pixel's top side waveguides 240 in order to sufficiently collimate the light generated from the pixels 230 that is being coupled into the optical aperture of a matched aperture micro optical element or lens 206. The pixel-level micro optical element 206 is designed to further collimate or to directionally modulate the micro pixel 230 light emission (U.S. Patent Application Publ. No. 2017/0184776). The combination of the pixel's 230 top side waveguides 240 and the pixel-level micro optical element 206 enables numerous applications of the M-QPI imager 200 where the collimation angle and directionality of the imager's light emission is of importance; such as in light field displays, in particular for near-eye and direct-view light field display applications.

Turning back to FIG. 2C, the M-QPI imager 200 is comprised of two main semiconductor structures; namely the photonic light emitting semiconductor structure 210 and the digital semiconductor structure 220. The photonic light emitting semiconductor structure 210 is comprised of a plurality of emissive color-tunable semiconductor light emitting micro pixels. The digital semiconductor structure 220 is comprised of the digital drive logic circuits that provide power and control signals to the array of pixels 230 of the photonic semiconductor structure 210. The semiconductor structure 210 has a top contact layer 205 and a back contact layer 215 that couple electrical drive signals to the individual pixels 230 of the M-QPI imager 200 pixel array.

The semiconductor structures 210 and 220 are bonded together by the bonding layer 225 either using die-level bonding, wafer-level bonding or the like. The emissive top side of the M-QPI imager 200 is encapsulated with a transparent cover layer 204 that is bonded to the imager top side using either die-level bonding or wafer-level bonding. Each of the two semiconductor structures 210 and 220 comprising the M-QPI imager 200 is further comprised of multiple semiconductor layers. As illustrated in FIG. 2A, the digital semiconductor structure 220 of the M-QPI imager 200 of one embodiment may be larger in surface area than the emissive pixel array area to allow for placement of the digital structure 220 edge contact pads 221, through which the power and image data signals are provided to the M-QPI imager 200, to be accessible at the top side of the imager for external interface connections using wire bonding or the like.

In another embodiment of the M-QPI imager 200 of this disclosure, illustrated in the isometric view of FIG. 2B, the area of the digital structure 220 is approximately equal to the area of the array of emissive pixels 230 with minimal or no lateral protrusion beyond the emissive pixel array area optical aperture. In this embodiment, the transistor/circuit geometry of the digital control structure 220 is selected such that the layout area of the entire digital structure 220 is not larger than the area of the array of emissive pixels 230. In this case, the imager contacts 222 may be realized as a micro ball grid array (MBGA) disposed on the backside or rear surface of the imager and connected to the digital control structure 220 using through-silicon vias (TSVs). This embodiment minimizes or eliminates protrusion of the M-QPI imager total area beyond the emissive pixel array optical aperture.

The benefits to be realized by this embodiment are at least: (1) minimizing the total volumetric aspects of the M-QPI imager 200 when integrated with other elements of the display system which is of particular importance when embedding the M-QPI imager into volumetrically sensitive mobile devices; and, (2) allowing a multiplicity of M-QPI imagers to be tiled together to form a larger emissive micro pixel array. The M-QPI imager configuration of this embodiment is herein referred to as a "Zero-Edge" M-QPI imager configuration. As illustrated in FIG. 2B, the Zero-Edge M-QPI emissive two-dimensional array of the color-tunable pixels 230 covers substantially the entire top or upper surface area of the device to form the emissive surface, or optical aperture, of the M-QPI imager 200.

The typical size of the pixels 230 of one embodiment of the Zero-Edge M-QPI imager 200 of this disclosure is in the range of 5×5 microns. At this pixel size, the dimensions of the emissive aperture comprising the top surface of an M-QPI imager 200 are about 6.4×3.6 mm which is approximately 23 mm$^2$; providing HD resolution at 1280×720 pixels. The small size and high resolution of the Zero-Edge M-QPI imager make it very effective in wearable display applications such as AR/VR displays. In particular, its small dimensions permit the entire Zero-Edge M-QPI to be integrated within optical assemblies of such displays without protrusions to enable a true wearable display that is streamlined in appearance.

FIG. 2C is a cutaway isometric illustration of a group of pixels 230 comprising the M-QPI imager 200 of either of the two previously discussed embodiments of this disclosure. FIG. 2C illustrates a cross-sectional view of one of the pixels 230 comprising the array of pixels of the M-QPI imager 200. As illustrated in FIG. 2C, each of the pixels 230 has a sidewall 235 that provides optical and electrical separation between adjacent pixels. The electrical interconnects required to supply power signals to the top contact layer 205 of the photonic semiconductor light emitting structure 210 are embedded within the pixel sidewalls 235. The light from each of the pixels 230 comprising the M-QPI imager 200 is emitted in a direction that is perpendicular to the plane of the imager top surface, hereinafter referred to as the vertical direction, either directly through the top surface of the pixel optical aperture or through the plurality of vertical waveguides 240 (FIG. 2D), each of which is optically coupled to the optical cavity of the pixel 230.

FIG. 2D illustrates an exemplary embodiment of the M-QPI imager 200 in which the light from each of the pixels 230 is emitted through a user-defined patterned array of optical waveguides 240, each coupled to a corresponding pixel 230 optical cavity. The waveguides 240 are etched through the pixels' 230 top contact metal layer 205. The diameter of each of the waveguides 240 and their specific array pattern 240 as well as the thickness of the pixels' 230 top contact metal layer 205 through which the waveguides 240 are etched (i.e., the depth of the waveguides 240) determines the degree of collimation of the light emitted from the M-QPI imager 200 pixels 230. Therefore, the design selection of the waveguides' 240 diameter, depth and pattern enable desired collimation of the light emitted from the M-QPI imager 200 pixels 230 from a quasi-Lambertian light emission of ±45° to a narrow collimation angle of ±15°, as dictated by the specific application. The unique capability of the M-QPI imager 200 to emit collimated light makes it suitable for use directly with total internal reflection (TIR) waveguide optics, most prevalent in wearable display applications, without the need for additional collimation optics that add bulkiness and cause excessive vignetting and loss of coupled light to the display viewer.

FIG. 2E illustrates an embodiment in which the design of the top contact metal layer 205 of the M-QPI imager 200 enables substantially Lambertian light emission. As illustrated in FIG. 2E, the top contact metal layer 205 of the M-QPI imager 200 allows efficient contact to the top side of the pixel photonic structure 210 while also allowing a maximum size pixel light emission aperture. Although the M-QPI imager 200 pixels' light emission is substantially Lambertian, the M-QPI imager 200 configuration of this embodiment allows maximum light irradiance to be coupled from the M-QPI imager 200 emissive aperture. Such a high brightness Lambertian light emission M-QPI imager 200 is useful in applications requiring very high brightness such as projection displays. The small size of the M-QPI imager 200 of this embodiment enables a volumetrically compact projector suitable for embedded mobile applications.

In another embodiment of the M-QPI imager 200, collimated light emission makes it possible to add a micro optics layer 206 to the M-QPI imager 200 structure immediately below the transparent cover layer 204, as illustrated in FIG. 2G (U.S. Patent Application Publ. No. 2017/0184776). The M-QPI imager 200 pixels' 230 micro optics element layer 206 enables nontelecentric light emission from the M-QPI imager 200 that is used to further collimate the light emitted from each of the pixels 230. Alternatively, this embodiment can be used to modulate the direction of the light emitted from the pixels 230 in order to make the imager suitable for numerous applications such as coupling directly into TIR waveguide optics typically used in AR displays or modulating multi-views of light field displays (U.S. Pat. No. 7,767,479).

One of the novel aspects of this disclosure is the use of color-tunable solid state light emitting diode III-Nitride material to form the pixels' 230 multi-color emitting diode structure 210 which minimizes electrical interconnects through the pixel structure and reduces the number of addressable contacts per pixel to a single contact in addition to the common contact used for the entire M-QPI imager pixel array. The use of a single photonic semiconductor layer 210 to enable the M-QPI imager 200 pixels 230 multi-color light emission substantially simplifies the M-QPI imager manufacturing process in addition to reducing the pixel pitch to below 5μ due to the fact that each of the M-QPI imager pixels requires only one unique addressable contact.

M-QPI Imager Color-Tunable Semiconductor Structure

Figure 3A:
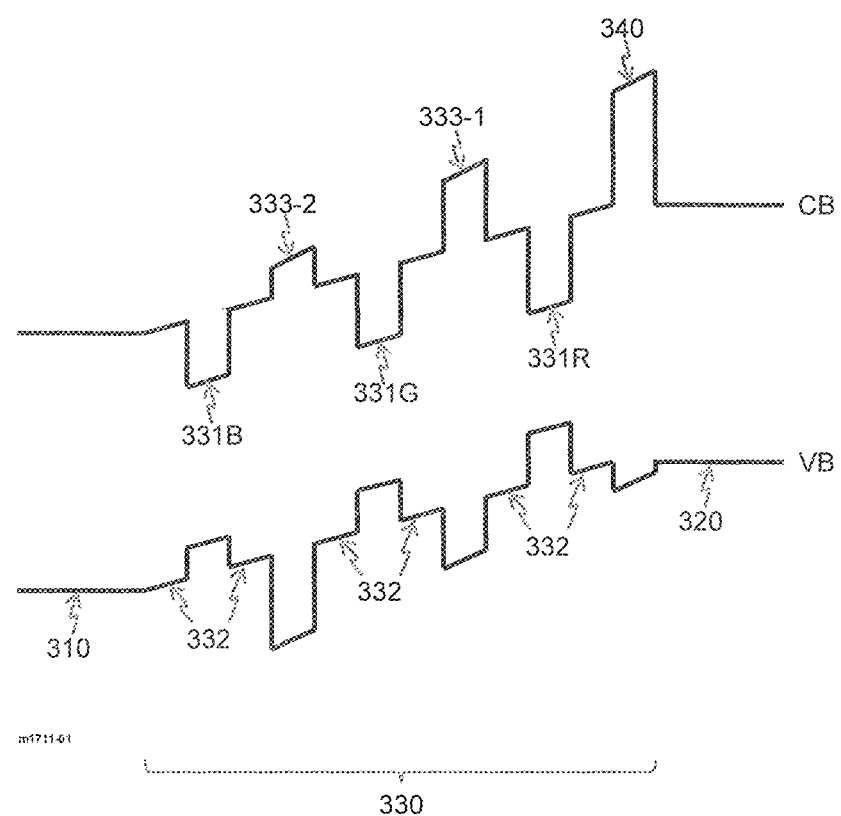
FIG. 3A illustrates an energy band profile exemplifying the hetero-junction multi-layer quantum confinement-based light-emitting diode structure comprising the photonic structure of the color-tunable multicolor Monolithic Quantum Photonic Imager device of this disclosure.

FIG. 3A shows an energy band profile exemplifying the hetero-junction multi-layer quantum-confinement-based light-emitting diode structure 300 of FIG. 3D comprising the photonic structure 210 of the M-QPI imager 200. FIG. 3D is a cross-sectional view of the semiconductor photonic structure 210 that forms M-QPI imager 200 pixels' 230 multi-color light emitting diode of this disclosure. The same reference numbers are used for the same elements, however color-tunable light emitting layers of the photonic structure 210 prior to the formation of the pixels 230 are herein referred to as the multilayer semiconductor light emitting diode structures 300.

In accordance with one embodiment of the fabrication method of the M-QPI imager 200 of this disclosure, the multilayer light emitting diode epitaxial structure 300 is fabricated separately as a semiconductor wafer using appropriate epitaxial growth semiconductor processes, then post-processed to create the wafer-size multilayer photonic semiconductor structure 210 that incorporates the pixels' sidewalls 235 and metal contact layers 205 and 215 as illustrated in FIG. 2C. The digital semiconductor structure 220 is fabricated separately as a semiconductor wafer using appropriate semiconductor processes, such as silicon-based CMOS, then wafer-level or die-level bonded with the multilayer stack photonic semiconductor structure 210 to create the M-QPI imager 200 illustrated in FIG. 2A or FIG. 2B.

The following paragraphs describe design specifications of the multilayer light emitting diode structures 300 and the digital semiconductor structure 220 as well as design specifications of the wafer's post-processing and fabrication flow that can be used to create the M-QPI imager 200 of this disclosure.

FIG. 3A shows an active region energy band profile exemplifying the hetero-junction multi-layer quantum confinement-based light-emitting diode structure 300. The specially designed intermediate carrier blocking layers (IBLs) 333 having optimized user-defined band-gaps as defined by their respective compositions, and having user-defined band offsets relative to the structures in the optically active region 330 as affected by their doping levels, are incorporated directly into the optically active region 330 to provide means for selectively controlling the carrier transport between the active sub-regions 331 and balancing the active sub-regions' 331 carrier capture rates. The multiple layers of the light-emitting diode structure of FIG. 3A may be comprised of III-V compound semiconductor alloys such as GaAsP, AlGaAs, AlGaInP, or AlGaInN, depending upon the targeted or desired emission wavelength range of the light-emitting diode structure 300. The methods described herein as exemplified by the diode structure of FIG. 3A are applicable to solid state light emitting diode structures with either polar, or semi-polar, or non-polar crystalline structures having optically active layers incorporating means of quantum confinement such as quantum wells, quantum wires or quantum dots.

Of particular interest in display applications is the use of III-Nitride (AlGaInN) material for the epitaxial growth of the hetero junction multi-layer quantum confinement-based light-emitting diode structure 300 since the band gap range of III-Nitride material covers the entire visible light spectrum. Without limiting the scope of the forgoing disclosure, III-Nitride material is used in the illustrated examples of the various aspects of this disclosure, however other III-V materials can be used depending upon the desired multicolor emission spectral wavelength range to be covered by the M-QPI imager 200 of this disclosure.

FIG. 3D illustrates the multilayer light emitting diode epitaxial structure 300. FIG. 3D shows a simplified schematic cross-sectional view of an illustrative, but non-limiting, embodiment of a monolithic multicolor hetero-junction multi-layer quantum confinement III-Nitride-based light emitting diode epitaxial structure 300 according to the present disclosure. The multilayer epitaxial structure 300, which can be formed using known epitaxial deposition techniques such as metal organic chemical vapor deposition (MOCVD), is epitaxially grown on a suitable substrate 311, e.g., a GaN, Si, sapphire ($Al_2O_3$), or silicon carbide (SiC) wafer with a nucleation/buffer layer 312 formed thereon, and an overlying N-doped layer 310 of the hetero-junction structure 300, e.g., comprising Si as an N-type dopant. Overlying the N-layer 310 is multi-layered optically active region 330, e.g., comprised of a combination of GaN, InGaN, AlGaN, and AlInGaN layers. Overlying the active region 330 is an optional electron blocking layer (EBL) 340 typically comprised of heavily P-doped AlGaN and followed by a P-doped layer 320, e.g., both comprising Mg as a P-type dopant.

As illustrated in detail in FIG. 3D, multi-layer (MQW) active region 330 comprises a plurality of quantum well-based optically active sub-regions; for Blue 331B, Green 331G and Red 331R light emission, with their respective quantum barrier layers 332. Each of the optically active sub-regions 331B, 331G, 331R comprise at least one QW layer with its band gap selected to achieve a respective wavelength emission. The thickness of each of the barrier layers 332 is about 5-10 nm-thick and comprised mainly of GaN. The quantum wells of the optically active sub-regions 331B, 331G and 331R are each about 2-3 nm-thick and comprised of $In_xGa_{1-x}N$. The ratio of the $indium_x$ in the sub-regions 331B, 331G and 331R determines the band gap associated with the quantum confinement layers of these sub-region and therefore their emission wavelengths.

The multi-layer active region 330 also comprises a plurality of specially designed intermediate carrier blocking layers (IBLs) 333 of $Al_xGa_{1-x}N$ incorporating varied amounts of aluminum (Al) and doping to adjust their respective band-gaps and band offsets. In this context, the term band offset refers to the energy offset of the IBLs' 333 band gaps relative to the active region 330 intrinsic band gap. The IBLs 333 function to selectively control the population of injected carriers into the respective MQWs of the active region 330 in order to enhance their spontaneous light emission. Typically, the band-gap of an IBL will be greater than that of their associated quantum well layer and the IBL thickness is selected to avoid quantum confinement within the IBL, in the range of 10 nm, but not excessively thick in order to avoid resultant high forward voltage and excessive heating that can lead to performance degradation. As illustrated in FIG. 3A, the IBLs' band gaps and band offsets, as determined by their material composition and doping type and levels, may be selected depending on their position within the active region 330 and are selected to specifically control the flow of charge carriers into their respective sub-regions 331B, 331G and 331R depending upon the injection level of carriers into the active region 330. As illustrated in FIG. 3A, typically the IBLs' 333 conduction band (CB) edges are progressively higher toward the P-doped side 320 of the structure and their valence band (VB) edges are progressively lower toward the N-doped side 310 of the structure.

The IBLs 333 play an important role in enabling injection current level-based selective carrier injection into the quantum wells of the optically active sub-regions 331B, 331G and 331R. As illustrated in FIG. 3A, the IBL2 333-1 positioned between 331R and 331G sub-regions and the IBL2 333-2 positioned between 331G and 331B material composition and doping are selected such that: (1) the conduction band (CB) edges of IBL1 333-1 and IBL2 333-2 are higher than the CB edge of the QW barrier layers 332; (2) the valence band (VB) edges of IBL1 333-1 and IBL2 333-2 are lower than the VB edges of the QW barrier layers 332; (3) the conduction band (CB) edge of IBL1 333-1 is higher than the CB edge of IBL2 333-2; and (4) valence band (VB) edge of IBL2 333-2 is lower than the VB edge of IBL1 333-1.

With appropriately designed IBLs 333 composition and doping levels (U.S. Patent Application Publ. No. 2016/0359300), the light emission of the multilayer light emitting diode epitaxial structure 300 is dominated by the 331R active sub-region at low current injection range, by the 331G active layer at medium current injection range and by the 331B active sub-region at high current injection range. This effect is illustrated in FIG. 3E which illustrates the relative optical emission power $\alpha_n = L_n / \Sigma L_n$, where index n represents the active layers 331B, 331G and 331R across the full range of injection current. As shown in FIG. 3E, the Red active sub-region 331R dominates the emission at the low current injection range, indicating that a majority of the injected carriers are selectively populating the Red active sub-region 331R.

When the current injection increases, the Green active sub-region 331G dominates the emission indicating that a majority of the injected carriers at higher current are selectively populating the Green active sub-region 331G. When the current injection increases further, the Blue active sub-region 331B dominates the emission, indicating that a majority of the injected carriers at the higher current are selectively populating the Blue active sub-region 331B.

The above described selective carrier injection effect occurs as a direct result of the carrier blocking, damping or inhibiting action of the IBLs 333-1 and 333-2 at different current injection levels:

(1) At low current injection range, the hole blocking action of Red/Green IBL1 333-1 causes the injected holes to predominantly populate the Red active sub-region 331R as the electrons, attracted by the polarization field of the hole-congested Red active layer 331R, also predominantly populate the Red active layer 331R, thus causing the Red active layer 331R to dominate the emission as shown in FIG. 3E.

(2) When the current injection level is increased, the electron blocking action of Red/Green IBL1 333-1 causes the injected electrons to predominantly populate the Green active layer 331G, as the holes, attracted by the polarization field of the electron-congested Green active layer 331G, transport beyond Red/Green IBL1 333-1 and also predominantly populate the Green active layer 331G, thus causing the Green active sub-region 331G to dominate the emission as shown in FIG. 3E.

(3) When the current injection level is increased further, the electron blocking action of Blue/Green IBL2 333-2 causes the injected electrons to predominantly populate the Blue active layer 331B, as the holes, attracted by the polarization field of the electron-congested Blue active sub-region 331B, transport beyond Green/Blue IBL2 333-2 and predominantly populate the Blue active sub-region 331B, thus causing the Blue active sub-region 331B to dominate the emission as shown in FIG. 3E.

The described injection current-dependent carrier blocking actions of the IBLs 333-1 and 333-2 therefore, cause injection current-dependent selective injection of the injected carriers into the three active sub-regions 331R, 331G and 331B to realize the injection current-dependent multicolor-tunable properties, illustrated in FIG. 3E, of the multilayer light emitting diode epitaxial structure 300.

Epitaxially Grown Design Example

Figure 3B:
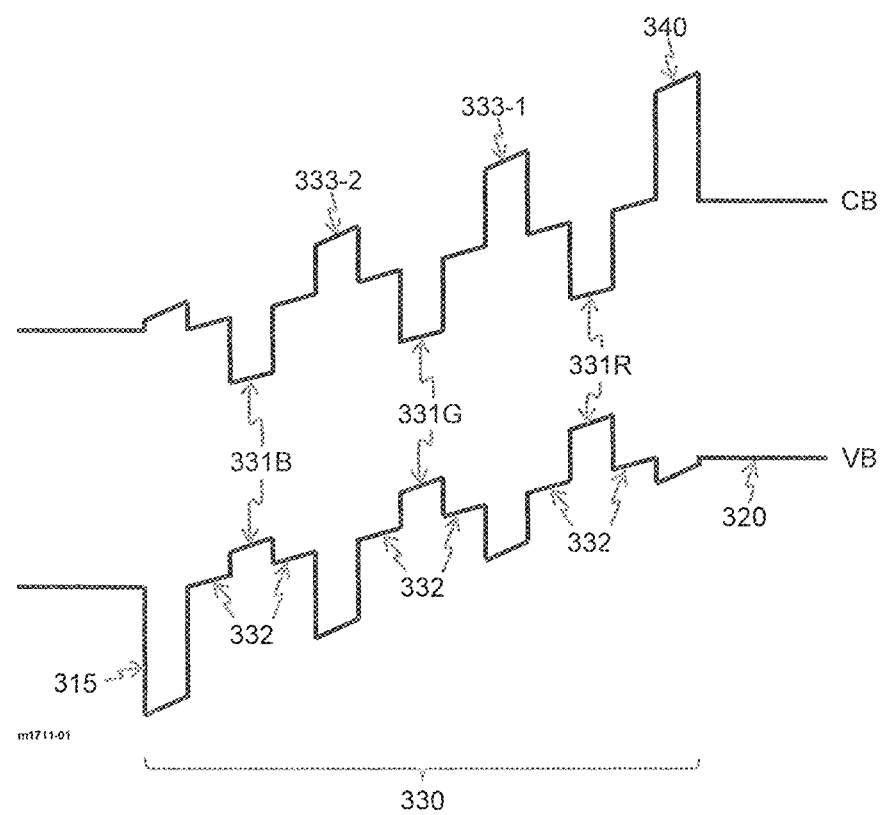
FIG. 3B illustrates an energy band profile exemplifying the hetero-junction multi-layer quantum confinement-based light-emitting diode structure comprising the photonic structure of the color-tunable multicolor Monolithic Quantum Photonic Imager device of this disclosure incorporating means for balancing the current injection-controlled optical emission power and the associated color gamut spectral locus in the Blue light emission region.
Figure 3C:
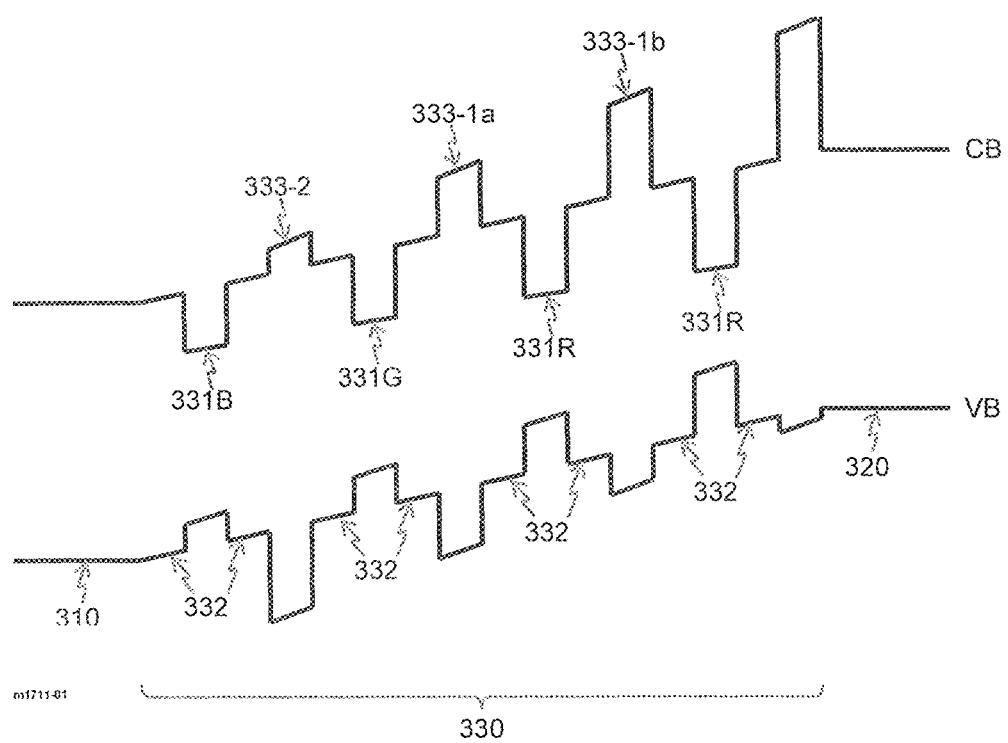
FIG. 3C illustrates an energy band profile exemplifying the hetero-junction multi-layer quantum confinement-based light-emitting diode structure comprising the photonic structure of the color-tunable multicolor Monolithic Quantum Photonic Imager device of this disclosure incorporating means for balancing the current injection-controlled optical emission power and the associated color gamut spectral locus in the Red light emission region.
Figure 3E:
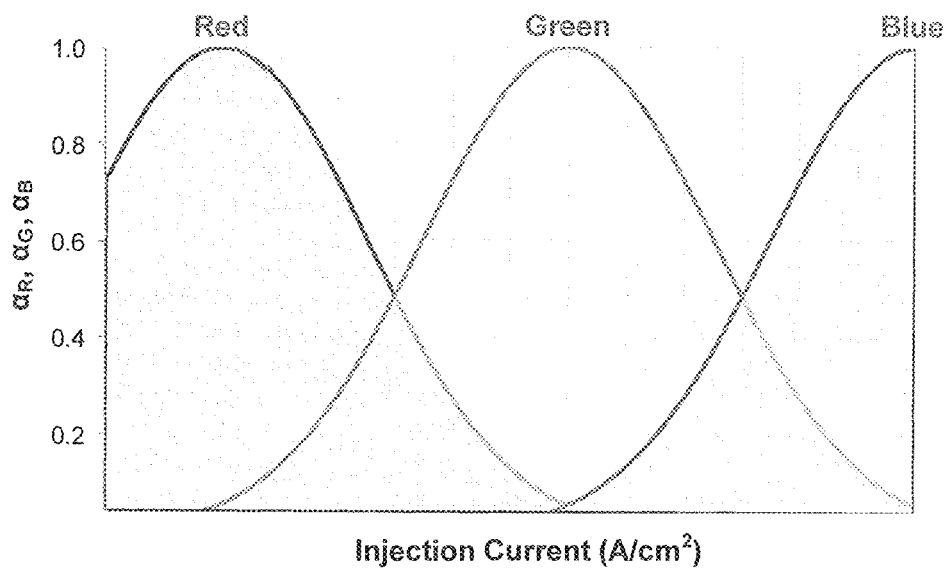
FIG. 3E illustrates the relative optical emission power of the active layers of the semiconductor photonic structure that forms the pixels of the color-tunable Monolithic Quantum Photonic Imager device of this disclosure.
Figure 3F:
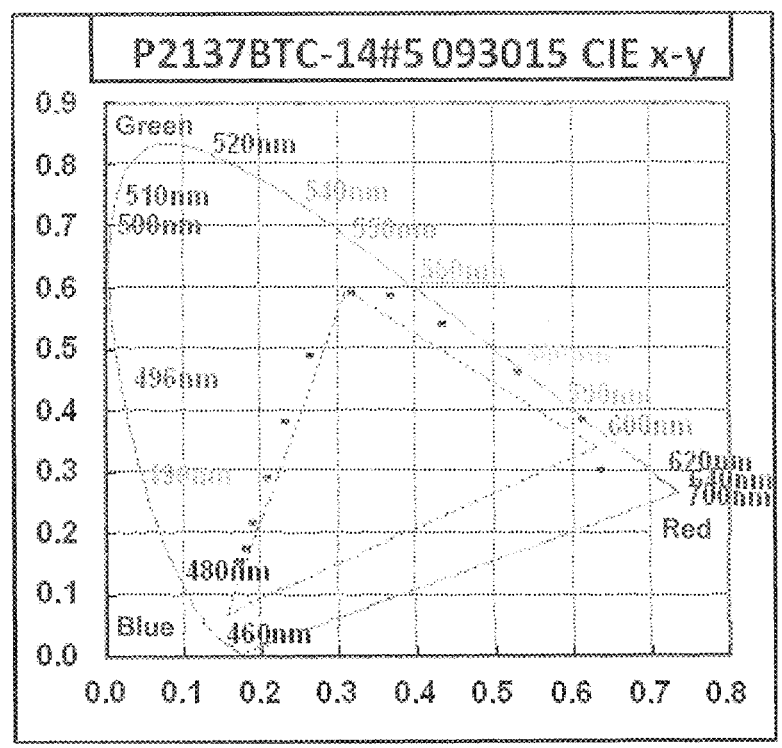
FIG. 3F illustrates a CIE color gamut of an exemplary epitaxial design of the semiconductor photonic structure that forms the pixels of the color-tunable Monolithic Quantum Photonic Imager device of this disclosure.

FIG. 3F illustrates a CIE color gamut of an exemplary design of the multilayer light emitting diode epitaxial structure 300 with the QWs of the optically active sub-regions 331B, 331G and 331R $In_xGa_{1-x}N$ composition selected at x=0.12, x=0.27 and x=0.34 to achieve light emission wavelengths at 625 nm, 525 nm and 465 nm; respectively. The IBLs 333-1 and 333-2 $Al_yGa_{1-y}N$ composition and doping are selected at y=0.2, $15 \times 10^{17}$ Mg doped and y=0.07, $5 \times 10^{17}$ Mg doped; respectively. FIG. 3F shows that the multilayer light emitting diode structure 300 epitaxially grown in accordance with this disclosure achieves nearly full coverage of the high definition (HD) color gamut. It is important to note that any color point along the emission spectral locus shown in FIG. 3F, achieved by the multilayer light emitting diode structure 300 epitaxially grown in accordance with this disclosure, can be selected, as will be described in subsequent paragraphs, by controlling the carrier injection rate (or current drive level) of the structure 300.

Figure 3G:
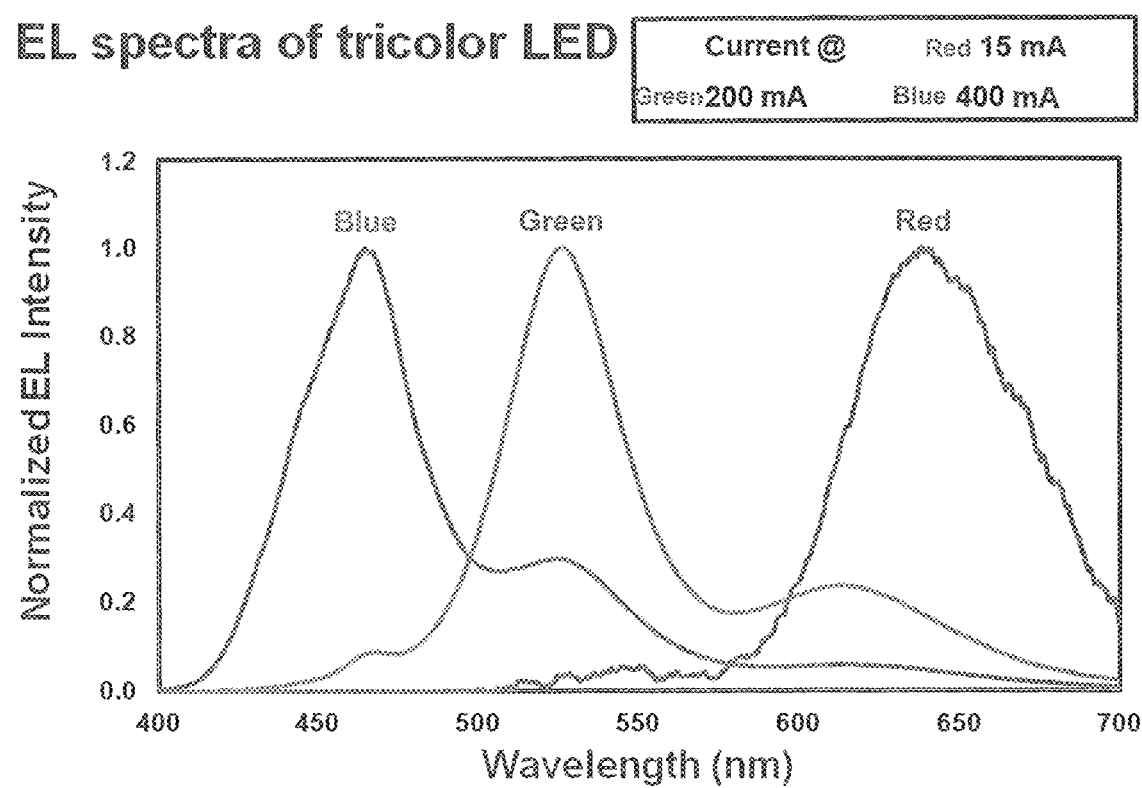
FIG. 3G illustrates the measured electroluminescence (EL) spectra of an exemplary epitaxial design of the semiconductor photonic structure that forms the pixels of the color-tunable Monolithic Quantum Photonic Imager device of this disclosure.
Figure 3H:
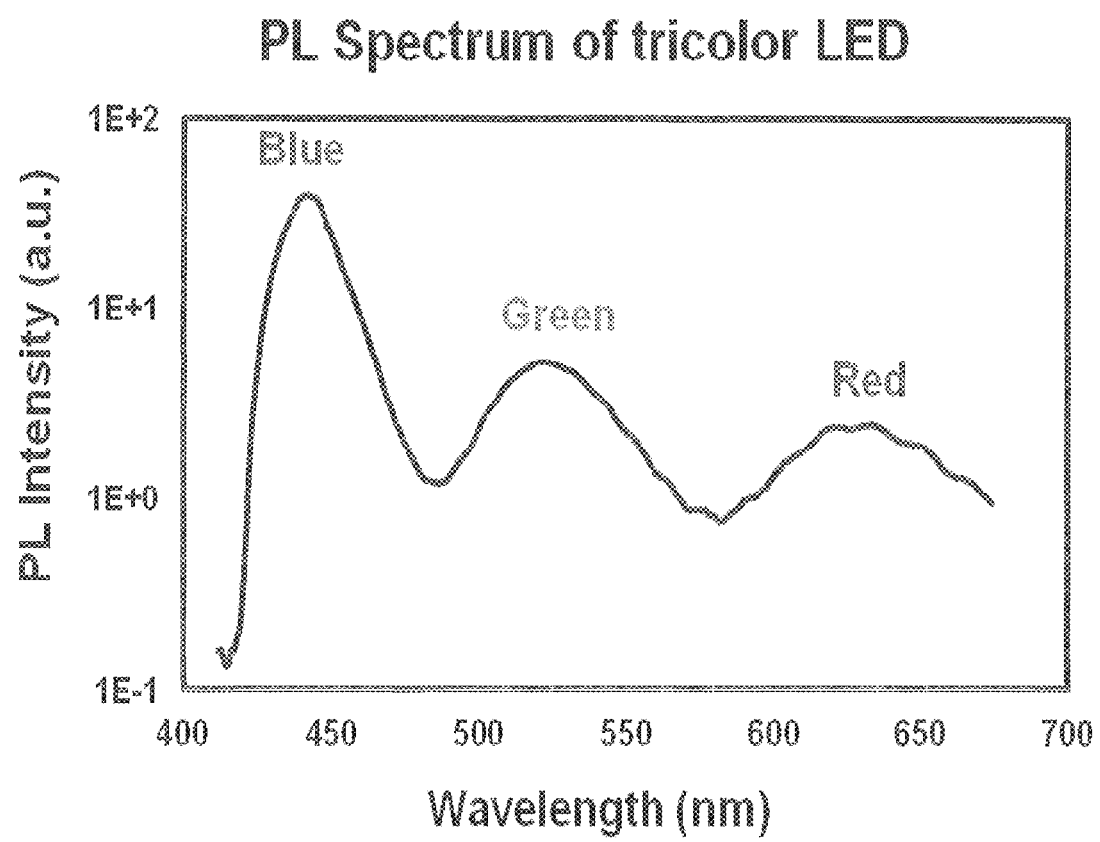
FIG. 3H illustrates the measured the photoluminescence (PL) spectra of an exemplary epitaxial design of the semiconductor photonic structure that forms the pixels of the color-tunable Monolithic Quantum Photonic Imager device of this disclosure.

The emissions of FIG. 3G and FIG. 3H show the measured electroluminescence (EL) and the photoluminescence (PL) spectra; respectively, of an exemplary design of the multilayer light emitting diode epitaxial structure 300. FIG. 3G shows the normalized EL spectra measured at room temperature at a low (red line), moderate (green line), and high (blue line) injection current density.

For a low current density of about 0.5 A/cm² (lower subplot), the light emission is predominantly in the 625 nm Red color with a full width at half maximum (FWHM) around 50 nm. For a moderate current density of about 10 A/cm², the light emission is predominantly in the 525 nm Green with a full width at half maximum (FWHM) around 45 nm. For a current density of about 50 A/cm², the light emission is predominantly in the 465 nm Blue color with a full width at half maximum (FWHM) around 35 nm.

As can be seen from FIG. 3F and FIG. 3G, the multicolor light emission the multilayer light emitting diode epitaxial structure 300 is tunable across the HD color gamut from Red, to Green then to Blue dominated color emission by controlling its injection current across its designed operating range. Henceforth, the multilayer light emitting diode epitaxial structure 300 is referred to as "multicolor-tunable light emitting diode epitaxial structure 300".

As explained above and illustrated in FIG. 3F, the $In_x Ga_{1-x}N$ composition, thus the band gaps, of the QW-based optically active layers 331B, 331G and 331R determines the color coordinates of the color gamut corners and the $Al_y Ga_{1-y}N$ composition and the doping of the IBLs 333-1 and 333-2 determines the emission color trajectory that forms the spectral locus between these color gamut corners as the current injection of the multicolor-tunable light emitting diode structure 300 is varied across its low to high operating range. The number of quantum wells (QWs) in each of the optically active sub-regions 331B, 331G and 331R is a design parameter of the multicolor-tunable light emitting diode structure 300. The relative optical emission power or luminous flux $a_n = L_n/\Sigma L_n$, where index n, represents the optically active layers 331B, 331G and 331R; respectively, and can be balanced by properly selecting the number of QWs in each of the optically active layers 331B, 331G and 331R. For example, achieving the Blue color gamut corner, which occurs at high current injection, may require incorporating more than one QW in the Blue active layer 331B. Also, achieving the required luminous emission power associated with the Red color gamut corner may require incorporating more than one QW in the Red active layer 331R.

Balancing the relative optical emission power $\alpha_n = L_n/\Sigma L_n$ ensures effective utilization of the color tuning dynamic range of the multicolor-tunable light emitting diode structure 300. The total optical emission power, or luminous flux, $\Sigma L_n$, of the multicolor-tunable light emitting diode structure 300 is current injection i dependent as a weighted sum of the optical emission power of its optically active sub-regions 331B, 331G and 331R, $$\Sigma L_n = L(i) = \alpha_R(i)L_R + \alpha_G(i)L_G + \alpha_B(i)L_B$$

$$\alpha_R(i) + \alpha_G(i) + \alpha_B(i) = 1$$

Where $\alpha_R(i)$, $\alpha_G(i)$ and $\alpha_B(i)$ represent the (relative) optical emission power contribution of the optically active layers 331B, 331G and 331R respectively, of the multicolor-tunable light emitting diode structure 300 at current injection level i. The parameters $\alpha_R(i)$, $\alpha_G(i)$ and $\alpha_B(i)$ are proportional to the ratios of the total injected carriers that end up populating the optically active layers 331B, 331G and 331R at the current injection level i. The values of the parameters $\alpha_R(i)$, $\alpha_G(i)$ and $\alpha_B(i)$ across the current injection i operating range of the multicolor-tunable light emitting diode structure 300 determine the spectral locus of its color gamut.

In another embodiment illustrated in FIG. 3B, further balancing of the current injection-controlled optical emission power and the associated color gamut spectral locus may be achieved through the addition of an N-doped $Al_y Ga_{1-y}N$ carrier blocking layer 315 between the N-doped layer 310 and the MQW active region 330 at the N-side of the multicolor-tunable light emitting diode structure 300. The blocking layer 315 reduces the possible transport of holes beyond the Blue active sub-region 333B in response to the strong polarization field caused by a highly electron-congested Blue active sub-region 333B at high current injection levels. The addition of the carrier blocking layer 315 enables higher optical emission power from the Blue active sub-region 333B at a lower injection current level, thus enabling the emission from the Blue active sub-region 333B to reach the Blue corner of the color gamut using fewer QWs in that sub-region.

In another embodiment illustrated in FIG. 3C, further balancing of the current injection controlled optical emission power and the associated color gamut spectral locus is achieved through the addition of the P-doped $Al_y Ga_{1-y}N$ carrier blocking layer 331b between the two QWs of the Red sub-region 331R of the active region 330 of the multicolor-tunable light emitting diode structure 300. The blocking layer 331b together with the blocking layer 331a serve to extend the current injection range of the Red sub-region 331R. The addition of an additional QW and its associated carrier blocking layer 331b with Red sub-region 331R enables higher optical emission power within the Red wavelength spectral emission range of the multicolor-tunable light emitting diode structure 300.

In addition to their role in balancing the current injection-controlled optical emission power and the associated color gamut spectral locus, the IBLs 333-1 and 333-2 and the $Al_y Ga_{1-y}N$ layer 315 serve as epitaxial strain relief layers within the multicolor-tunable light emitting diode epitaxial structure 300. This added function of the aluminum (Al) containing layers 315, 333-1 and 333-2 is an important feature in attaining the successively higher indium (In) intake ratio required to achieve multicolor light emission from the optically active sub-regions 331B, 331G and 331R.

M-QPI Imager Control Semiconductor Structure

Figure 4A:
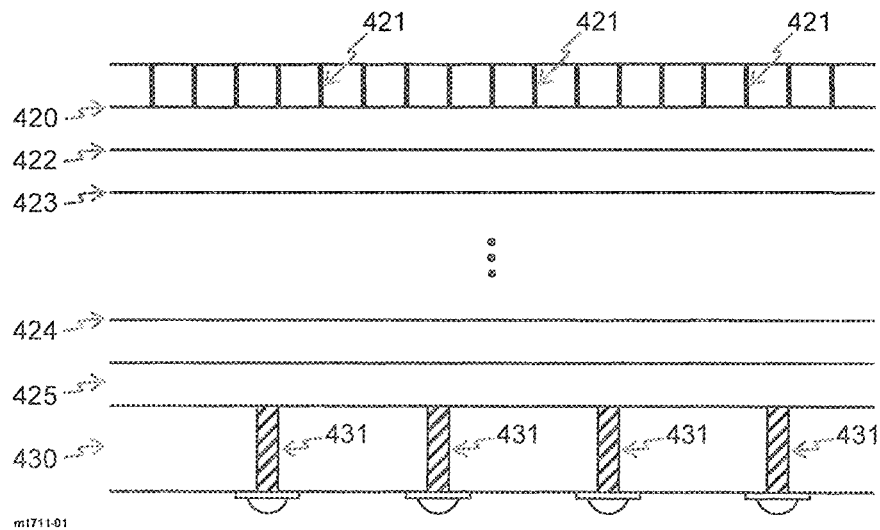
FIG. 4A illustrates a cross section of the digital semiconductor structure of the color-tunable Monolithic Quantum Photonic Imager device of this disclosure.

FIG. 4A illustrates a cross section of the digital semiconductor structure 220 of the M-QPI imager 200. The digital semiconductor structure 220 may be fabricated using conventional Si-based complementary metal oxide semiconductor (CMOS) techniques and be comprised of multiple metal layers 420, 422, 223, and 424, separated by thin layers of insulating semiconductor material such as $SiO_2$ and control logic 425, which comprises the pixels' driver array 450, the processing logic 460 and the interface logic 465, and may deposited using conventional CMOS semiconductor techniques on the Si-substrate 227. Deposited on top of the metal layer 420 are the pixels' contact vias 421 and through-silicon-vias (TSVs) 431 that provide connectivity between the control logic 425 and the eutectic solder contact balls 222, which provide external interface connectivity to the control logic 425.

Figure 4B:
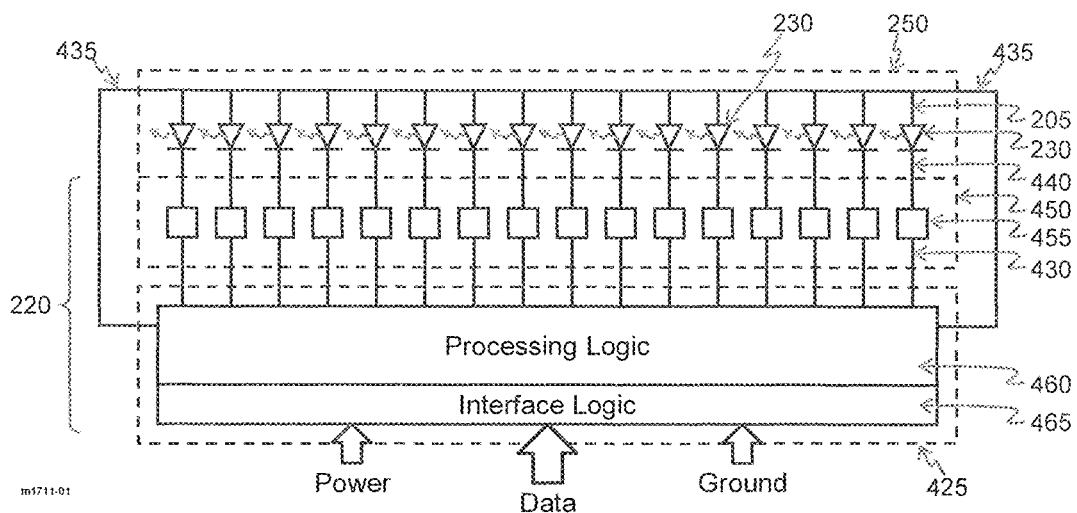
FIG. 4B illustrates a functional block diagram of the digital semiconductor structure of the color-tunable Monolithic Quantum Photonic Imager device of this disclosure.

FIG. 4B illustrates a functional block diagram of the digital semiconductor structure 220 of the M-QPI imager 200. For the purpose of clarity, the emissive multicolor pixels 230 array 250 is shown connected to the pixels' drivers 455 array 450 which provides the interface between the control logic 425 and the emissive multicolor pixels 230 array 250. Each of the pixels' drivers 455 converts the electrical control signal it receives from the control logic 425 via the internal interface 430 into the appropriate electrical signal (voltage) level to each of the multicolor pixels' 230 unique contacts 440. The common contact metal layer 205 (FIGS. 2C, 2D and 2E) of the emissive multicolor pixels 230 array 250 are connected to the control logic 425 via the sidewalls of the pixel array 250 edge pixels. The interface block 465 of the control logic 425, which is connected to the eutectic contact balls 222, connects power and ground signals to the entire digital semiconductor structure 220 and relays received digital image data to the processing logic 460.

Figure 4C:
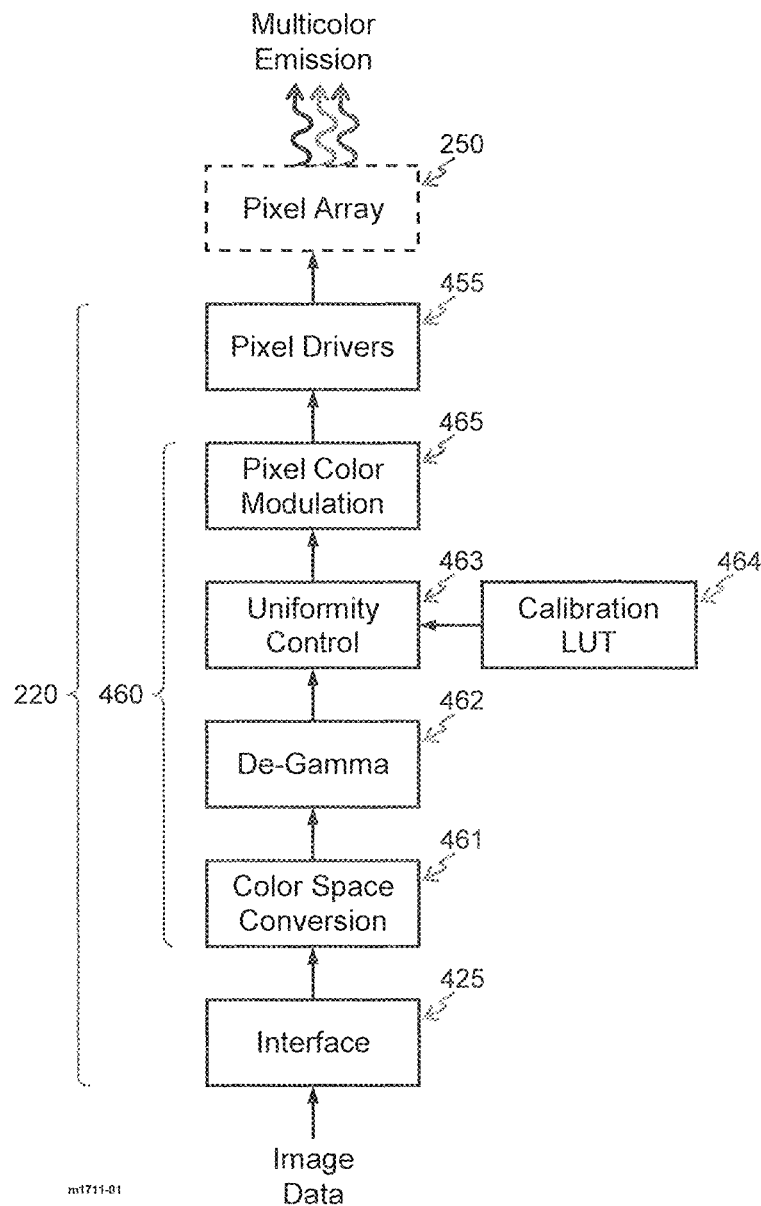
FIG. 4C illustrates a functional block diagram of the processing logic within the overall context of the color-tunable Monolithic Quantum Photonic Imager device of this disclosure.

FIG. 4C illustrates a functional block diagram of the processing logic 460 within the overall context of the M-QPI imager 200. The processing logic 460 may be realized either as a dedicated digital logic or as software executed on an embedded digital signal processing core designed to have matching processing functions and throughput.

As illustrated in FIG. 4C, the input image data coupled into the digital semiconductor structure 220 by the interface block 425 is first processed by the color space conversion processing block 461 which converts the received image data from its input color space to RGB color space which is consistently used throughout the image processing steps comprising the processing logic 460. The color space-converted image data is then linearized by the de-gamma block 462, then pre-corrected to compensate for the pixel's 230 color and brightness non-uniformity across the pixel array 250. The pixel's 230 uniformity pre-correction is accomplished using the pixel array 250 calibration look up table (LUT) 464 measured at the end of the M-QPI imager 200 fabrication process. The pre-corrected image data is then converted into pixel-specific modulation values by the pixels' color modulation block 465 and the pixels' color modulation data is provided as an input to the pixels' drivers 455 which in turn converts the pixels' color modulation data into electrical drive signals to the individual pixels 230 of the pixel array 250.

Figure 4D:
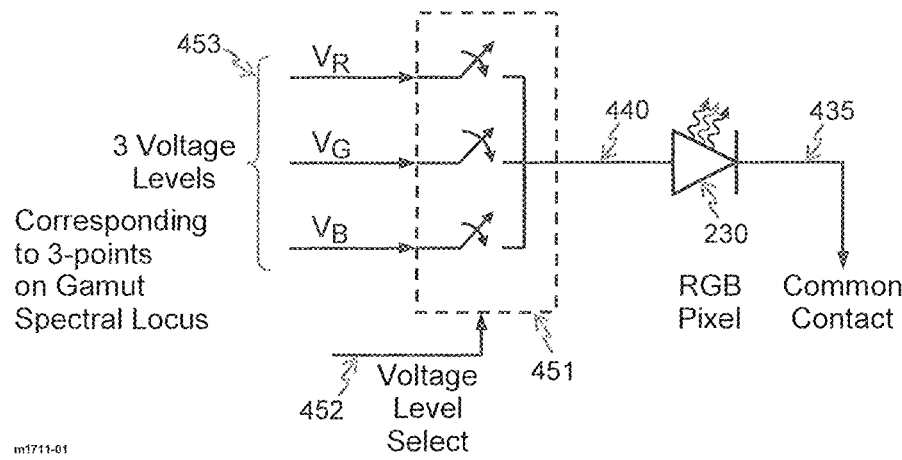
FIG. 4D illustrates a functional block diagram of a first embodiment of the pixel driver of the color-tunable Monolithic Quantum Photonic Imager device of this disclosure.

FIG. 4D illustrates a functional block diagram of a first embodiment of the pixels' drivers 455. Since the pixels' 230 semiconductor light emitting diode drive current is typically related to its drive voltage by Shockley diode equation (the diode current i is related to the diode voltage v by the Shockley (i, v) diode equation:

$$i = I_S \left( e^{\frac{v}{nV_T}} - 1 \right);$$

where $I_s$ is the diode saturation current, $V_T$ is the thermal voltage $$\left( \frac{kT}{q} \right)$$

and n is the diode ideality factor.), in this embodiment as well as other subsequent embodiments, controlling the pixels' 230 multicolor emission by controlling the pixels' 230 current injection level is, without loss of generality, equivalently accomplished by controlling the pixels' 230 voltage drive level. In this embodiment, the pixels' drivers 455 are comprised of the voltage level switching block 451 that is controlled by the pixel modulation signal 452, which is generated by the pixel color modulation block 465 of FIG. 4C, to route the selected voltage levels 453 to the pixel 230 unique contact 440. In this embodiment, the pixel modulation signal 452 enables one of the multiple voltage levels comprising 453 (three voltage levels are illustrated as an example in FIG. 4D), to be routed to the pixel 230 unique contact 440 for a specified on-time period, whereby such a time period is a portion of the image video frame duration. For a common 60 Hz video frame rate, for example, the image video frame duration is 16.67 ms.

Herein, the on-time period of a specified pixel color emission is referred to as the "color modulation period $T_m$". In one embodiment, the selected voltage level 453 is provided to the pixel 230 unique contact 440 for a specified on-time period as a continuous waveform (CW) signal to enable continuous time modulation of the pixel 230. In another embodiment, the selected voltage level 453 is provided to the pixel 230 unique contact 440 for a specified on-time period as a sequence of pulsed waveform (PW) signals at the selected voltage level 453 to enable pulsed modulation of the pixel 230. In both cases, the pixel modulation signal 452 enables selection of the voltage level 453 and the duration of on-time. The pixels' drivers 455 of this embodiment enable single to multiple voltage level(s) modulation of the pixel 230 in either CW or PW modulation modes.

In the first embodiment of the pixel driver 455, control of the pixel 230 color emission may be accomplished using one of multiple methods. In the CW modulation case, the multiple voltage levels 453 are selected such that each of the multiple voltage levels 453 corresponds to one of the pixel's 230 light emission spectral ranges. For example, in the case where the pixel driver 455 has three voltage levels 453, the lowest voltage level is commensurate with the voltage required to achieve pixel 230 light emission in the Red spectral range, while the middle voltage level is commensurate with the voltage required to achieve pixel 230 light emission in the Green spectral range and the highest voltage level is commensurate with the voltage required to achieve pixel 230 light emission in the Blue spectral range. Control of the pixel 230 color in this method is accomplished by the pixel modulation signal 452 specifying the desired color emission range for the pixel 230 and in response, the pixel driver 455 routes the corresponding voltage level to the pixel 230 contact.

The PW modulation case of the first embodiment of the pixel driver 455 may be implemented with either a single or a multiplicity of the voltage levels 453. In the method of this embodiment in which single voltage level PW modulation is used, the pixel 230 multicolor emission is controlled across its full spectral range by controlling the carrier injection rate within the duration of the color modulation period of the pixel 230 multicolor emission. In the method of this embodiment, the single voltage used for PW modulation is that needed to enable pixels' 230 light emission within the spectral range requiring the highest value of voltage level within the associated modulation period, which, in this case, is the Blue spectral range within the modulation period $T_{mB}$.

For pixels 230 light emission in the Green and Red spectral ranges, the PW modulation rate, and consequently the associated carrier injection rate, is proportionally reduced by increasing the modulation period such that $T_{mB} < T_{mG} < T_{mR}$ in order to achieve the desired color emission in the Green and Red color emission regions; respectively. In the method of this embodiment in which PW modulation with a multiplicity of voltage levels is used, the pixel 230 multicolor emission is controlled across regions of the full spectral range by controlling the carrier injection rate at each of the voltage levels, for example, where the full spectral range of the pixel 230 multicolor emission is divided into two regions of Red-Green emission and Green-Blue emission regions (with possibly some overlap). In the Red-Green emission region, the lower of the two voltage levels used for PW modulation is commensurate with enabling pixels 230 light emission in the Green spectral range within the modulation period $T_{mG}$ and the color emission across the Red-Green spectral range is at a proportionally increased modulation period such that $T_{mG} < T_{mR}$.

In the Green-Blue emission range, the higher of the two voltage levels used for PW modulation is commensurate with enabling pixels 230 light emission in the Blue spectral range within the modulation period $T_{mB}$ and a color emission across the Green-Blue spectral range is at a proportionally increased modulation period such that $T_{mB} < T_{mG}$. Similarly, the pixel 230 full spectral emission may be divided into three regions, for example Red, Green and Blue emission regions. In this case, the pixel 230 light multicolor emission is controlled across the full spectral range by selecting the voltage level that is commensurate with the desired spectral region, then selecting the duration of the modulation period $T_m$ that is commensurate with the desired emission color within the selected spectral region. This is a novel solution for pixel 230 color modulation of the PW modulation method of the first embodiment of the pixel driver 455 and enables direct modulation of the pixel 230 color emission across the full range of its gamut spectral locus.

Figure 4E:
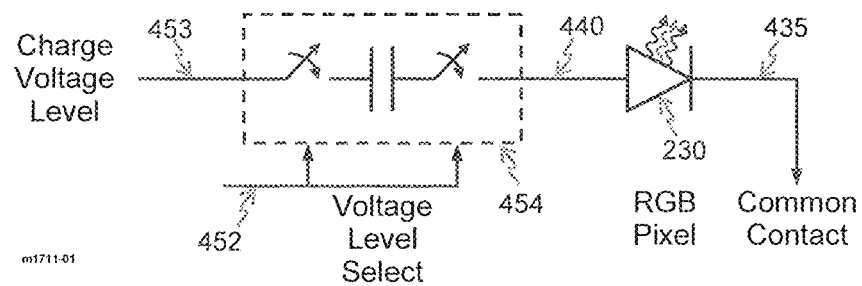
FIG. 4E illustrates a functional block diagram of a second embodiment of the pixel driver of the color-tunable Monolithic Quantum Photonic Imager device of this disclosure.

FIG. 4E illustrates a functional block diagram of a second embodiment of the pixels' drivers 455. In this embodiment, the pixels' drivers 455 are comprised of a capacitor-based energy storage element 454 with charge and discharge rates that are controlled by the pixel's 230 modulation signal 452, which is generated by the pixel color modulation block 465 of FIG. 4C. In this embodiment, a single voltage level is used to charge capacitor-based energy storage element 454 and the pixel modulation signal 452 controls the amount of energy charged into the capacitor-based element 454 and the duration of the modulation period $T_m$ during which time such stored energy is routed to the pixel 230 unique contact 440.

In this embodiment, the pixels' 230 multicolor emission is controlled by controlling the rate at which excitation energy stored in the capacitor-based element 454 is delivered to the pixel 230. For example, the excitation of light emission from the pixel 230 in the Blue color range is achieved by charging the capacitor-based energy storage element 454 to its highest possible energy storage level, then discharging the stored energy at a voltage level that is commensurate with the voltage level required for achieving pixel 230 light emission in the Blue color spectral range within the modulation period $T_{mB}$.

In general, excitation of light emission from the pixel 230 at any desired color within its full spectral range requires charging the energy storage element 454 to a value that corresponds with required color emission, then discharging the stored energy at a voltage level and within a modulation period $T_m$ that is commensurate with achieving pixel 230 light emission at the required color within the full spectral range the pixel 230. Similar to the first embodiment, this second embodiment of the pixel driver 455 enables a novel method of direct modulation of the pixel 230 color emission across the full range of its gamut spectral locus.

Figure 4F:
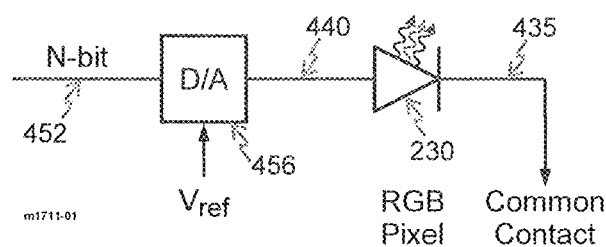
FIG. 4F illustrates a functional block diagram of a third embodiment of the pixel driver of the color-tunable Monolithic Quantum Photonic Imager device of this disclosure.

FIG. 4F illustrates a functional block diagram of a third embodiment of the pixels' drivers 455. In this embodiment, the pixels' drivers 455 are comprised of a digital-to-analog (D/A) converter 456 having as an input the pixel modulation signal 452 expressed as a digital signal comprised of N-bits. In this case, the pixel modulation signal 452 is converted by the D/A 456 into the pixel 230 voltage drive level that is a scaled value of the D/A reference voltage $V_{ref}$ in proportion to the pixel modulation signal 452 N-bit value. In one embodiment, the D/A 456 reference voltage $V_{ref}$ may be selected to be the voltage value necessary to enable pixels' 230 light emission within the spectral range requiring the highest value of voltage level within the associated modulation period, which, in this case, is the Blue spectral range within the modulation period $T_{mB}$. Driving the pixel 230 color emission in the Blue spectral range requires the N-bit pixel modulation signal 452 to be at a maximum value within the modulation period $T_{mB}$. Driving the pixel 230 light emission in the Green and Red spectral ranges requires a proportionally reduced value of the N-bit pixel modulation signal 452 with a commensurate increase in the modulation period such that $T_{rio} < T_{mG} < T_{mR}$ in order to achieve the desired color emission in the Green and Red color emission regions; respectively. Similar to the previous embodiment, the pixels' drivers 455 of this embodiment also modulate the drive signal to the pixels' 230 as a voltage level modulated CW for a specified modulation period $T_m$.

In another embodiment, the D/A 456 case reference voltage $\backslash T_{ref}$ is selected to be the voltage value needed to enable pixels 230 light emission within the required spectral range. For example, Blue, Green or Red spectral emission ranges and the N-bit pixel modulation signal 452 are used to control the specific color within each spectral range with the appropriate selection of the modulation period $T_{mC}$. In this embodiment, adjusting the D/A reference voltage $V_{ref}$ defines the pixel 230 color spectral emission range while the N-bit pixel modulation signal 452 word defines the specific color point within that range. For example, when three discrete values of the D/A reference voltage $V_{ref}$ are selected, for example defining the Blue, Green or Red spectral emission ranges, the dynamic range for controlling the pixel 230 color spectral emission is $3 \times 2^N$. In effect, therefore, the number of the discrete values of the D/A reference voltage $V_{ref}$ together with the word-length of the pixel modulation signal 452 are selected to control the resolution in selecting the pixel 230 color emission.

The pixels' 230 modulation signal 452 enabled by the described methods of the previous embodiments of the pixels' drivers 455 are illustrated in FIGS. 4G, 4H, 4I and 4J.

Figure 4G:
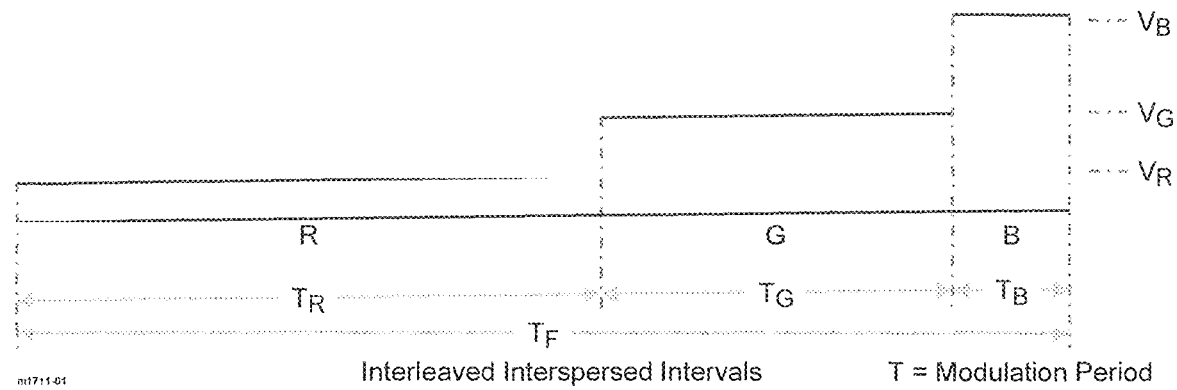
FIG. 4G illustrates a pixel modulation signal enabled by the embodiments of the pixel driver of the color-tunable Monolithic Quantum Photonic Imager device of this disclosure.

FIG. 4G illustrates the pixels' 230 drive method in which the drive signal 452 provided to the pixel 230 unique contact 440 to modulate its multicolor light emission is a correspondingly modulated discrete multilevel voltage signal with each discrete voltage level $V_m$ being modulated for the modulation period modulation period $T_m$. In this pixel 230 drive method, the selected voltage level $V_m$ and its corresponding period modulation period $T_m$ determine the color emitted from the pixels' 230 and its corresponding luminance; respectively. In this pixel 230 drive method, the pixels' 230 "color" and "luminance" are modulated by the selected voltage level $V_m$ and modulation period $T_m$ values enabled by the pixels' drivers 455 through the pixel modulation signal 452. As an illustrative example, FIG. 4G shows three discrete voltage levels $V_m$ with their collective corresponding period modulation periods $T_m$ spanning the entire video frame duration $T_F$, which in the case of a 60 Hz video frame rate, for example, is 16.7 ms. In this example, the three discrete voltage levels 14, and modulation periods $T_m$ correspond to pixel 230 light emission in the Red, Green and Blue color spectral regions at a specified luminance for each color in order to enable pixel 230 emission of a specific (color, luminance) during the video frame duration $T_F$. For example, if the pixel 230 is to emit light at the display white (color) point, the voltage levels 14, and modulation periods $T_m$ are selected by the pixel modulation signal 452 to enable the Red, Green and Blue color emission from the pixel 230 at the appropriate luminance balance to achieve white (color) emission during the video frame duration $T_F$.

Figure 4H:
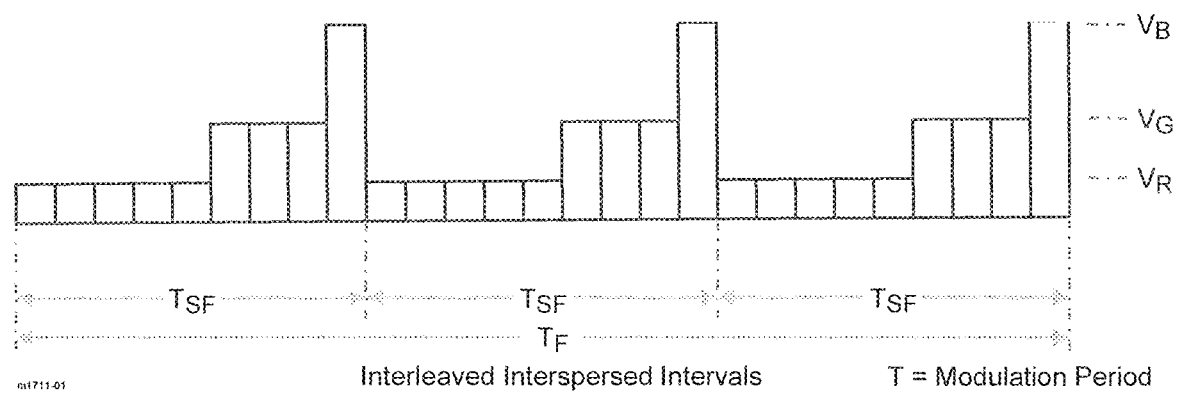
FIG. 4H illustrates a pixel modulation signal enabled by the embodiments of the pixel driver of the color-tunable Monolithic Quantum Photonic Imager device of this disclosure.

Alternatively, as illustrated in FIG. 4H, the entire video frame duration $T_F$ is divided into sub-frames of durations $T_{SF}$ during each of which the voltage levels 14, are selected for proportional modulation sub-periods $T_{sm}$. Similarly in this case, the voltage levels 14, and modulation periods $T_{sm}$ are selected by the pixel modulation signal 452 to enable the Red, Green and Blue color emission from the pixel 230 at the appropriate luminance balance to achieve white (color) emission during the video frame duration $T_{SF}$ and subsequently during the entire video frame duration $T_F$. It is noted that the pixels' 230 drive method described in the above paragraph can also be realized using a larger number of discrete voltage levels than used in the previous example to enable the pixels' 230 color and luminance with more color points across the pixel 230 multicolor emission spectral locus described earlier. In other words, the pixels' 230 drive method can be used with any number of primary colors (more than three if desired) that are defined along the pixels' 230 light emission spectral locus by selecting their corresponding voltage levels as the set of discrete voltage levels $V_m$ for this drive method. The pixels' 230 drive method described in this paragraph can be realized using either of the above described first, second or third embodiments of the pixels' drivers 455 whereby in each case the pixel modulation input signal 452 to the pixels' drivers 455 is appropriately designed to enable selection of the voltage level $V_m$ and modulation period $T_m$ values.

Figure 4I:
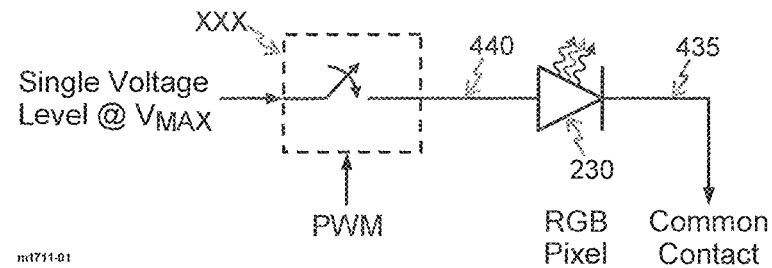
FIG. 4I illustrates a pixel modulation drive circuit of the color-tunable Monolithic Quantum Photonic Imager device of this disclosure.

FIG. 4I illustrates another pixels' 230 drive method in which the drive signal supplied to the pixel 230 unique contact 440 to modulate its multicolor light emission is a continuously-modulated variable voltage level signal in contrast with the set of discrete continuous voltage levels of the previous method. In this pixel 230 drive method, which may be enabled by the above embodiments of the pixels' drivers 455, the voltage level $V_m$ being modulated within the modulation period $T_m$ can be at any value within a voltage range $(V_{min}, V_{max})$, where the values of $V_{min}$ and $V_{max}$ are the voltage levels required for achieving pixel 230 light emission at the longest $\lambda_{max}$ and shortest $\lambda_{min}$ wavelengths, respectively, of the pixel's 230 spectral emission locus, for example the Red and the Blue spectral emission regions; respectively.

It is important to note that this drive method enables driving the pixel 230 to directly emit any color along the pixel spectral emission locus by selecting the corresponding voltage level $V_m$ and, similar to the previous case, the modulation period $T_m$ during which the modulated voltage level $V_m$ is sustained. This, in proportion to the total video frame duration $T_F$, determines the luminance level of the color emitted from the pixel 230. The pixels' 230 drive method described in this paragraph is realized using either of the described second or third embodiments of the pixels' drivers 455 whereby in each case, the pixel modulation signal 452 inputs to the pixels' drivers 455 are appropriately designed to enable the selection of the modulation voltage level $V_m$ at any value within a voltage range $(V_{min}, V_{max})$ to achieve any desired pixel 230 light emission color along the pixel 230 spectral emission locus $(\lambda_{max}, \lambda_{min})$ and selecting the corresponding modulation period $T_m$ value during which the selected voltage value is sustained to achieve the desired luminance at the emitted color from the pixel 230. Besides the ability of this drive method to modulate any color point along the pixel 230 spectral locus, this drive method can be used to modulate a discrete set of color points along the pixel 230 spectral emission locus during the video frame duration $T_F$ with the relative luminance associated with each of the modulated color points being modulated by selecting modulation period $T_m$ during which the voltage level $V_m$ corresponding to that color point is sustained during the video frame duration $T_F$.

Figure 4J:
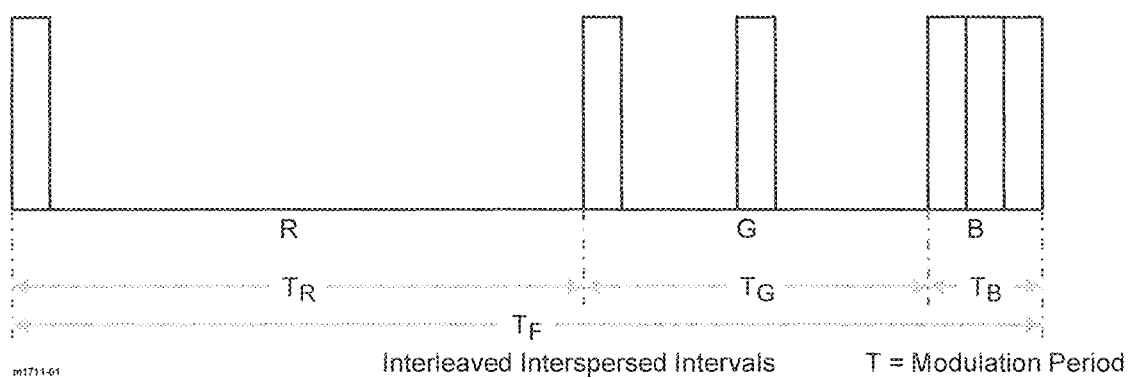
FIG. 4J illustrates a pixel modulation signal enabled by the embodiments of the pixel driver of the color-tunable Monolithic Quantum Photonic Imager device of this disclosure.

FIG. 4J illustrates another pixels' 230 drive method in which the drive signal supplied to the pixel 230 unique contact 440 to modulate its multicolor light emission is a sequence of pulses modulated using a pulsed waveform (PW) of one or more voltage levels $V_m$ whereby each voltage level is modulated for the modulation period modulation period $T_m$.

In this method, a number N of PW voltage pulses of a given time width $T_P$ (duration) are modulated using a given voltage level $V_m$ during the modulation period modulation period $T_m$. The modulation duty cycle multiplied by the value of the selected voltage level $V_m$ determines the average pixel modulation voltage, $V_{avg}=(NT_P/T_m)V_m$; with $NT_P \leq T_m$. Since the pixels' 230 semiconductor light emitting diode drive current is generally exponentially proportional to its drive voltage, the average pixel modulation voltage $V_{avg}$ is equivalent to the average current or average carrier injection rate into the pixels' 230. Thus this pixels' 230 drive method enables the modulation of any of the light emission color points along the spectral locus of the pixels' 230 by selecting the values of voltage pulses modulation duty cycle, $D=NT_P/T_m$ at the selected voltage level $V_m$ that generate an average pixel modulation voltage $V_{avg}$ that corresponds to the target color points along the spectral locus of the pixels' 230 at their target luminance. When this pixels' 230 drive method is used with a single voltage level, the voltage level required for achieving light emission at the Blue region of the pixels' 230 of the spectral locus would preferably be the selected single voltage level; i.e., $V_m=V_{mB}$.

It is also possible that this pixels' 230 drive method be used with multiple voltage levels that divide the entire spectral locus of the pixels' 230 into corresponding spectral emission regions. For example, in using two voltage levels, the lower voltage level can be selected to be the voltage level that achieves light emission in the Green region of the pixels' 230 of the spectral locus, i.e., $V_m=V_{mG}$, and the higher voltage level can be selected to be the voltage level that achieves light emission at the Blue region of the pixels' 230 of the spectral locus, i.e., $1V_m=V_{mB}$. With this selection of two voltage levels, selecting the voltage pulses modulation duty cycle, $D=N_G T_P/T_{mG}$ at the lower voltage level $V_{mG}$ generates an average pixel modulation voltage $V_{Gavg}$ that achieves light emission along the portion of the pixels' 230 spectral locus from Red to Green. Selecting the voltage pulses' modulation duty cycle, $D=N_B T_P/T_{mB}$ at the higher voltage level $V_{mB}$ generates an average pixel modulation voltage $V_{Bavg}$ that achieves light emission along the portion of the pixels' 230 spectral locus from Green to Blue. Similarly, a higher number of voltage levels $V_m$ can be used to divide the pixels' 230 spectral emission into a higher number of regions that are selected in the previous examples, for example three voltage levels $V_m$ or higher, depending on the design tradeoff. The pixels' 230 drive method described in this paragraph can be realized using either of the described second or third embodiments of the pixels' drivers 455 whereby in each case, the pixel modulation signal 452 inputs to the pixels' drivers 455 are appropriately designed to enable selection of the voltage level $V_m$ and the voltage pulses modulation duty cycle D values within the modulation period $T_m$. Similar to the previous pixels 230 drive method, this method enables modulation of the pixel 230 emission at any color point along the pixels' 230 spectral locus with voltage pulses modulation duty cycle D values defining the modulated color point along the pixels' 230 spectral locus and the duration of their associated modulation period $T_m$ defining the achieved luminance at the modulated color points.

As is described in the following paragraphs of this disclosure, the described unique capability of the pixels' 230 drive methods to enable the modulation of any color and luminance (brightness) along the pixel 230 spectral emission locus enables novel methods to modulate any color point within the gamut defined by the pixel 230 spectral locus at any desired luminance level relative to a defined reference white point luminance. Such a capability enables the modulation of any color point within the gamut of the multicolor pixels 230 to be modulated using two, three or more reference color points (color primaries) along the pixel 230 spectral locus, thus providing the ability to modulate the desired color point within the gamut at the most efficient luminance balance of the reference color points. This, in effect, creates a set of programmable gamut color primaries (reference color points) that can be used to make efficient use of the pixel 230 multicolor tuning capability as well as other benefits that are described in following paragraphs.

The previous paragraphs described various methods for implementing the pixels' drivers 455 that may differ in their semiconductor (chip level) physical layout area. In addition, it is beneficial that the physical layout area of the digital structure 220, including the array of the pixels' drivers 455, be confined within of the pixels' 230 array area (i.e., the light emission aperture of the M-QPI imager 200).

Figure 5:
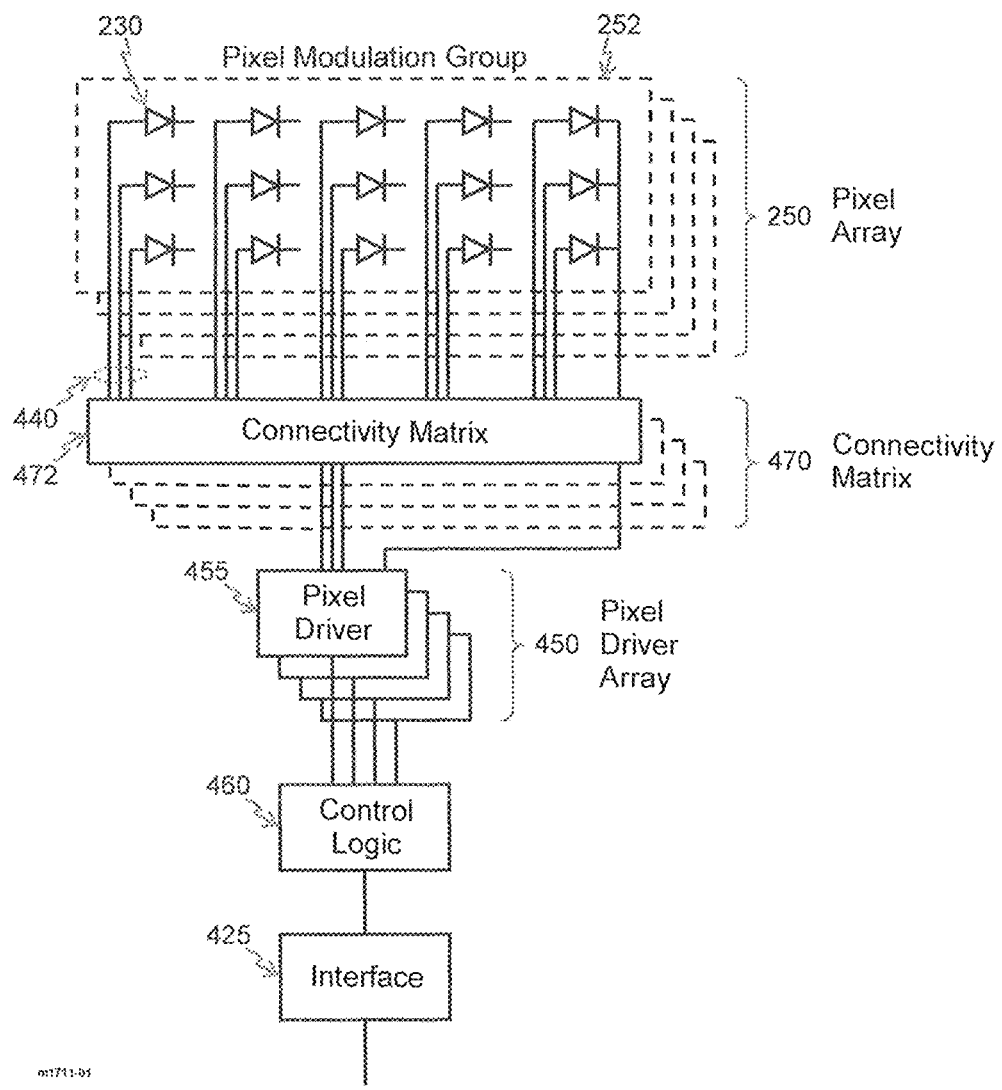
FIG. 5 illustrates an embodiment of the color-tunable Monolithic Quantum Photonic Imager device of this disclosure in which the layout area of the array of the digital structure matches the pixel array area.

FIG. 5 illustrates an embodiment in which the layout area of the array of the digital structure 220, including the array of the pixels' drivers 455, can be made to match the pixels 230 array 250 area using a given CMOS geometry to implement the digital structure 220 of the M-QPI imager 200. In this embodiment, the pixels' 230 array 250 is partitioned into a multiplicity of sub-arrays 252 of pixels 230, herein referred to as the modulation group 252, whereby the pixels 230 comprising a modulation group 252 are time-sequentially driven by a single driver 455. With this approach, the total number pixel drivers 455 needed is reduced to a number equal to the total number of pixels 230 comprising the pixel array 250 divided by the total number of pixels 230 comprising the modulation group 252.

As illustrated in FIG. 5, the array of modulation groups 252 is connected to the array 450 of pixel drivers 455 via the connectivity matrix 470 which is comprised of a multiplicity of connectivity elements 472. Each of the connectivity elements 472 comprising the connectivity matrix 470 is controlled by the control logic 460 to route the pixel modulation values it receives from the control logic 460 to the unique contact 440 of one of the pixels 230 comprising its corresponding modulation group 252. The entire connectivity matrix 470 is controlled by the control logic 460 to time-sequentially route pixel modulation values to a set of designated pixels 230 within the multiplicity of pixel modulation groups 252 in order to create a specified sequential modulation scan pattern of the entire pixel array 250 within the display frame duration $T_F$. For example, the connectivity matrix 470 may be designed to modulate a specified number of rows of pixels 230 (for example 8, 16, 32, 64 . . . rows) simultaneously, then sequentially modulate an equal number of rows in order to modulate the entire pixel array 250. In this example, the number of rows of pixels 230 that are modulated simultaneously determines the number of needed pixel drivers 455 and the combined layout area of this number of pixel drivers 455 plus the layout area of their associated connectivity matrix 470 determines the total layout area to be dedicated to driving the array 250 of pixels 230. The layout area needed for the control logic 460 and the interface block 425 plus the layout area needed for driving the array 250 of pixels' 230 determines the CMOS geometry needed to make the total layout area of the digital structure 220 match the area of the array 250 of pixels 230.

The digital semiconductor structure 220 of the M-QPI imager 200, incorporating the control logic 460 and the interface block 425 plus the layout area needed for driving the array 250 (as explained above), may be fabricated as a monolithic Si-CMOS wafer using appropriate CMOS geometry technology with each such wafer incorporating a multiplicity of M-QPI imager 200 die. As explained earlier, the digital semiconductor structure 220 wafer is bonded to the photonic semiconductor structure 204-205-210-215 using wafer-level direct fusion bonding techniques or the like to form an integrated multi (3D) wafer structure which is cut (diced) into individual M-QPI imager 200 die illustrated in FIG. 2A and FIG. 2B. Alternatively, either the digital semiconductor 220 wafer or the photonic semiconductor structure 204-205-210-215 may be cut (diced) into die that are separately die-level bonded to an opposing wafer using die-to-wafer direct bonding or eutectic bonding techniques or the like to form wafer incorporating multiplicity of M-QPI imager 200 die which is cut (diced) into individual the M-QPI imager 200 dies illustrated in FIG. 2A and FIG. 2B.

M-QPI Imager Operation—Pixel Color and Brightness Modulation

As explained earlier, the luminous flux L(i) of the pixel 230 light emission as a function of its current injection level i, or equivalently the voltage level applied across its contacts, is a weighted sum of the luminous flux ($L_R$, $L_G$, $L_B$) emitted from each of the pixel's 230 constituent photonic layers 331R, 331G and 331B:

$$L(i)=\alpha_R(i)L_R+\alpha_G(i)L_G+\alpha_B(i)L_B$$

$$\alpha_R(i)+\alpha_G(i)+\alpha_B(i)=1$$

Since the values of the weighting factors $\alpha_R(i)$, $\alpha_G(i)$, and $\alpha_B(i)$ are current-dependent, or equivalently voltage-dependent, and also control the relative contribution each of the pixel's 230 constituent photonic layers 331R, 331G and 331B, the value of the current injected into pixels' 230, or equivalently the value of the voltage across its contacts, controls the color point and luminous flux along spectral emission locus of the pixel's 230. Since the luminous flux of the pixels' 230 light emission from the Red to the Blue spectral regions is systematically higher in proportion to the pixels' 230 current injection level, or equivalently voltage level, the photometric luminance (perceived brightness) of the pixels' 230 at the modulated color point is controlled using the relative persistence time (or the relative modulation time $T_m/T_F$, where $T_F$ is the display frame duration) of the modulated color point. This means that both the pixels' 230 color and brightness can be controlled by the pixels' 230 current injection level, or equivalently voltage level.

Color Primaries

Using one of the pixels' 230 drive methods described in the previous embodiments, the chromaticity (color) and brightness (or chroma and luma) of the M-QPI imager 200 pixels 230 can be modulated using one of the multiple pixel modulation methods described herein using either a multiplicity of discrete CW or PW voltage levels or a single CW or PW variable voltage. The selected voltage levels, either discrete or variable, are temporally-multiplexed to synthesize a multiplicity of primary color points along the pixels' 230 spectral emission locus, herein these synthesized color points are referred to as "color primaries" for abbreviation, that are subsequently used to modulate the pixels' 230 light emission color and brightness during the display (video) frame duration $T_F$. Since the pixels' 230 light emission at any point along the pixels' 230 light emission spectral locus is a weighted sum of light emission from the pixels' 230 spectral gamut R, G and B corners, selecting these points effectively equates to selecting its associated weighted sum of light emission from the pixels' 230 spectral gamut RGB corners.

Also, since any color point along the pixels' 230 emission spectral locus can be selected by appropriately selecting its corresponding drive voltage level to be provided to the pixels' 230 by the pixels' drivers 455, practically any appropriately selected set of color points c along the pixels' 230 spectral locus, including the spectral gamut RGB corners, can be selected as modulation color primaries by selecting their corresponding drive voltage levels to be provided to the pixels' 230 by the pixels' drivers 455, then temporally multiplexing these selected voltage levels at the appropriate ratios $T=T_{mC}/T_F$ during the display (video) frame duration $T_F$ in order to modulate the desired color and brightness of the light emission from the pixels' 230.

Display White Point

Modulation of the pixels' 230 brightness is relative to a selected brightness level of the display white point. In an embodiment in which the pixels' 230 spectral gamut RGB corners are selected as color primaries, the display's maximum brightness level of the RGB color primaries are the brightness values of the color primaries required to achieve the desired white point brightness. Since in this embodiment the selected color primaries are the pixels' 230 spectral gamut RGB corners, their color and brightness correspond to the dominant spectral emission from each of the light emitting layers 331 of the pixels' 230. Accordingly, the brightness $L_W$ and chromaticity coordinates ($W_x$, $W_y$) of the display white point W are determined by the brightness ($L_R$, $L_G$, $L_B$) and the chromaticity coordinates ($R_x$, $R_y$), ($G_x$, $G_y$); and ($B_x$, $B_y$) respectively, of the M-QPI imager pixels' 230 RGB light emitting layers 331R, 331G and 331B as expressed by Eq. 2-1, and 2-2 below.

Brightness of White Point W $$L_W = \alpha_W L_R + \beta_W L_G + \gamma_W L_B$$

$$\alpha_W + \beta_W + \gamma_W = 1 \qquad \text{Eq. 2-1}$$

Chromaticity Coordinates of Color Point W $$W_x = \alpha_W R_x + \beta_W G_x + \gamma_W B_x$$

$$W_y = \alpha_W R_y + \beta_W G_y + \gamma_W B_y \qquad \text{Eq. 2-2}$$

In a further embodiment, an appropriately selected set of color points along the pixels' 230 spectral locus are used as color primaries for the modulation of the pixel's 230 color and brightness. In this embodiment, the maximum brightness level of any color point c along the pixels' 230 spectral locus when such color point is used as a modulation color primary is the brightness value of that color point required to achieve the desired display white point brightness.

Figure 6A:
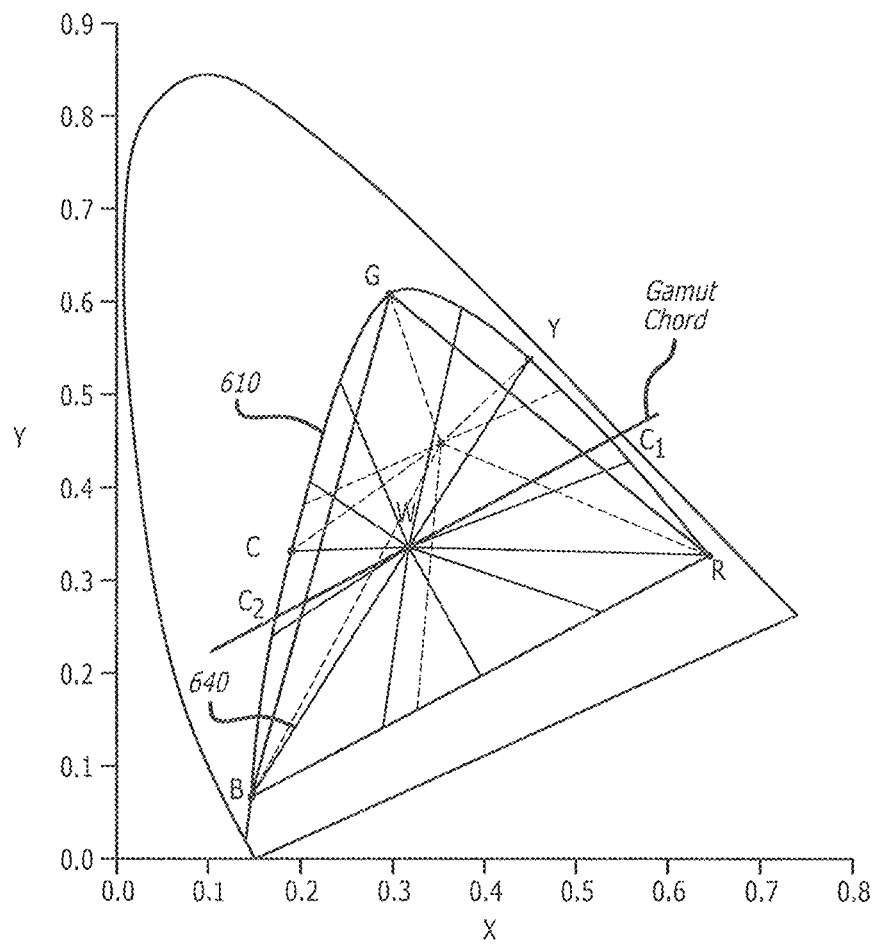
FIG. 6A illustrates an example of a multiplicity of candidate color points along the pixel spectral locus that is used for modulation of color primaries of the pixels of the color-tunable Monolithic Quantum Photonic Imager device of this disclosure.

FIG. 6A illustrates an example of a multiplicity of candidate color points c along the pixels' 230 spectral locus 610 that are used as pixel modulation color primaries. In this embodiment, by way of the example shown in FIG. 6A, the desired display white point W is selected to be D65, which corresponds to 6500° K display white point temperature. The chromaticity coordinates ($c_x$, $c_y$) and brightness $L_c$ of any color points c along the pixels' 230 spectral locus 610, including the exemplary candidate color points shown in FIG. 6A, are determined by the chromaticity coordinates ($R_x$, $R_y$), ($G_x$, $G_y$) and ($B_x$, $B_y$) and the brightness ($L_R$, $L_G$, $L_B$) of the M-QPI imager pixels' 230 RGB light emitting layers 331R, 331G and 331B as expressed by Eq. 2-3, 2-4 and 2-5 below:

Brightness of Color Point c $$L_c = \alpha_c L_R + \beta_c L_G + \gamma_c L_B$$

$$\alpha_c + \beta_c + \gamma_c = 1 \qquad \text{Eq. 2-3}$$

Chromaticity(x, y) Coordinates of Color Point c $$c_x = \alpha_c R_x + \beta_c G_x + \gamma_c B_x$$

$$c_y = \alpha_c R_y + \beta_c G_y + \gamma_c B_y \qquad \text{Eq. 2-4}$$

$$\alpha_c = \left(\frac{L_R}{L_R + L_G + L_B}\right)_c \qquad \text{Eq. 2-5}$$

Fraction of the Brightness of Color Point c Contributed by R Layer $$\beta_c = \left(\frac{L_G}{L_R + L_G + L_B}\right)_c$$

Fraction of the Brightness of Color Point c Contributed by G Layer $$\gamma_c = \left(\frac{L_B}{L_R + L_G + L_B}\right)_c$$

Fraction of the Brightness of Color Point c Contributed by B Layer

As explained earlier, the simultaneous emission color ratios ($\alpha_c$, $\beta_c$, $\gamma_c$) of the M-QPI imager 200 pixels' 230 light emitting RGB layers 331R, 331G and 331B; respectively, at each color point c along the pixels' 230 spectral locus, are dependent upon the pixels' 230 injection current level $i_c$ or equivalently, as explained earlier, its corresponding drive voltage value $v_c$. Hence, the color point c indexed brightness values ($L_R$, $L_G$, $L_B$)$_c$ in Eq. 2-5 above are meant to express the brightness ($L_R$, $L_G$, $L_B$) of the M-QPI imager 200 pixels' 230 light emitting RGB layers 331R, 331G and 331B; respectively, at the drive voltage value $v_c$ corresponding to the color point c along the pixels' 230 spectral locus 610.

Typically the brightness of a semiconductor light emitting hetero-junction diode similar to that comprising the M-QPI imager pixels' 230 is directly proportional to the injection current level across the diode junction, which is also related to the diode voltage drive level by the diode (i, v) equation.

Figure 6B:
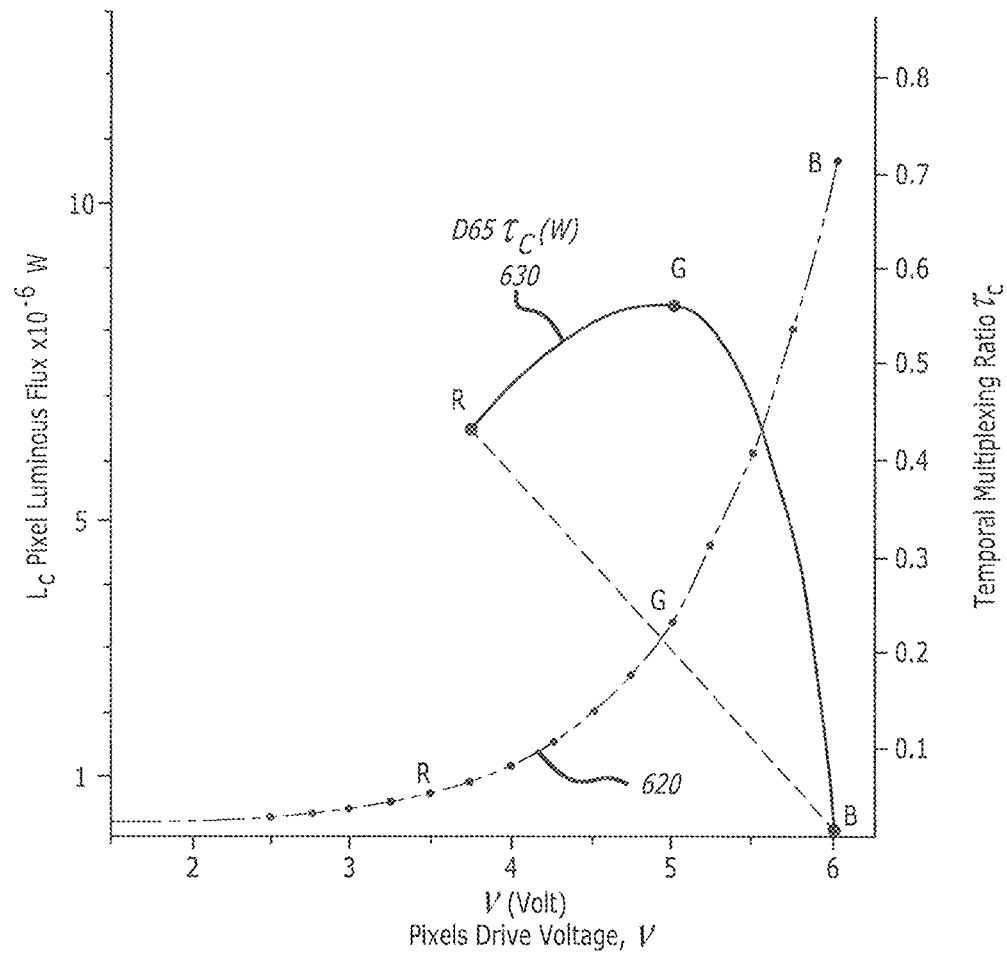
FIG. 6B illustrates brightness in relation to drive voltage of the pixels of the color-tunable Monolithic Quantum Photonic Imager device of this disclosure.

FIG. 6B illustrates the brightness (or luminance) of the M-QPI imager pixels' 230 in relation to its drive voltage. The curve 620 of FIG. 6B illustrates the brightness (or luminance) $L_c$ as expressed by Eq. 2-3 associated with an exemplary set of color points c along the M-QPI imager pixels' 230 spectral locus at their corresponding full duty-cycle voltage drive level $v_c$.

The corresponding brightness of the M-QPI imager pixels' 230 at spectral gamut RGB corners is marked (indicated) by the letters R, G and B; respectively, on the curve 620 of FIG. 6B as well as with the brightness of the intermediate of color points c along the M-QPI imager pixels' 230 spectral locus. Also as explained earlier, the trajectory of M-QPI imager pixels' 230 light emission along the spectral locus 610, and thus the chromaticity along the spectral locus 610 illustrated in FIG. 6A, is directly related to (or can be controlled by) the injection current level across the diode junction, which is related to the diode voltage drive level by the diode (i, v) equation. Thus, as illustrated by curve 610 of FIG. 6A and by curve 620 of FIG. 6B, the light emission from the M-QPI imager 200 pixels' 230 in addition to having a chromaticity that varies along the pixels' 230 spectral locus 610 from R→G→B in relation to the pixels' 230 voltage drive level $v_c$ as expressed by Eq. 2-4, has a brightness that increases in direct proportion to pixels' 230 voltage drive level $v_c$ along the pixels' 230 spectral locus as expressed by Eq. 2-3. Therefore, in order to set the display white point chromaticity and brightness when any appropriately selected set of color points c along the pixels' 230 spectral locus 610 are used as color primaries for the modulation of the pixel's 230 color and brightness, the temporal multiplexing ratio $\tau_c = T_{mc}/T_F$, associated with each of the color points c along the pixels' 230 spectral locus 610 is first scaled by the factor $\varepsilon_c = L_{max}/L_c = L_B/L_c$, which normalizes the brightness associated with the color points c relative to the maximum brightness along the pixels' 230 spectral locus 610. This, as illustrated in FIG. 6B, is the brightness associated with the B color primary point, then second, is further scaled relative to the desired brightness of the display white point $L_W$ as set forth by Eq. 2-1.

The resultant temporal multiplexing ratio $\tau_c = T_{mc}/T_F$, illustrated by curve 630 in FIG. 6B, sets the maximum brightness value of the corresponding color point c along the pixels' 230 spectral locus 610 when that point is used as a color primary for modulating the brightness and color of any point within the interior of the gamut contained with the spectral locus 610 of FIG. 6B. The resultant temporal multiplexing ratios $T_R$, $T_G$ and $T_B$ corresponding to the spectral gamut RGB corners, as marked (or indicated) on curve 630 of FIG. 6B, are the temporal multiplexing ratios used to generate the desired white point brightness used as a target white point for the display, which is selected to be D-65 in the example illustrated by curve 630 of in FIG. 6B.

Besides using temporal multiplexing ratios $\tau_R$, $\tau_G$ and $\tau_B$ corresponding to the spectral gamut RGB corners for generating the target display white point brightness, the temporal multiplexing ratio $\tau_c = T_{mc}/T_F$, illustrated curve 630 in FIG. 6B, of an appropriately selected set of color points c along the pixels' 230 spectral locus 610 can also be used to generate the target display white point brightness. In one embodiment, the criterion for selecting a set of the color points c along the pixels' 230 spectral locus 610 to generate the target display white point brightness is to select only one of the spectral gamut RGB corners plus the color points c along the pixels' 230 spectral locus 610 that lies at the intersection of the cross gamut line extending from the selected spectral gamut RGB corner to the target white point and the pixels' 230 spectral locus 610. For example as referenced in FIG. 6A, the blue (B) gamut corner together with the color point Y that lies at the intersection of line 640 in FIG. 6A that extends from the blue (B) gamut corner to the target display white point W, can be used at their corresponding temporal multiplexing ratio $\tau_c = T_{mc}/T_F$ indicated on curve 630 of FIG. 6B to generate the target display white point brightness.

In another embodiment, the criterion for selecting a set of the color points c along the pixels' 230 spectral locus 610 to generate the target display white point brightness is to select any color point pair ($c_1$, $c_2$) along the pixels' 230 spectral locus 610 that lie at the intersection of any gamut chord that contains the target display white point and the pixels' 230 spectral locus 610. For example as referenced in FIG. 6A, the two color point pair ($c_1$, $c_2$) along the pixels' 230 spectral locus 610 where the gamut chord passing through the target display white point W intersects the pixels' 230 spectral locus 610 can be used at their corresponding temporal multiplexing ratio $\tau_c = T_{mc}/T_F$ defined by curve 630 of FIG. 6B to generate the target display white point brightness.

It is noted that in the embodiment in which the gamut RGB corners are used to synthesize the target display white point W at the required brightness, three pixels' drive voltage levels are required to be temporally multiplexed at the multiplexing ratios $\tau_R$, $\tau_G$ and $\tau_B$ as defined by curve 630 of FIG. 6B while in the latter two embodiments, only two pixels' drive voltage levels are required to be temporally multiplexed at their corresponding multiplexing ratios $\tau_c$ in order to synthesize the target display white point W at the required brightness.

Display Color Point Modulation

When the color (or chromaticity) to be modulated by an M-QPI imager pixel 230 lies at any point along the pixels' 230 spectral locus 610, that color can be modulated by selecting its corresponding voltage level to drive the pixel 230. The required brightness to be modulated for that M-QPI imager pixel 230 is modulated by scaling the corresponding temporal multiplexing ratio relative to the target white point temporal multiplexing ratio $\tau_c = T_{mc}/T_F$ of that color point defined by curve 630 of FIG. 6B. For example, if full brightness at that color point is required to be modulated by the M-QPI imager pixel 230, then the full value of its corresponding white point temporal multiplexing ratio $\tau_c = T_{mc}/T_F$ defined by curve 630 of FIG. 6B is used to modulate the brightness of the M-QPI imager pixel 230. Similarly, if for example, 0.75, 0.5 or 0.25 brightness at that color point is required to be modulated by the M-QPI imager pixel 230, then its corresponding white point temporal multiplexing ratio $\tau_c = T_{mc}/T_F$ defined by curve 630 of FIG. 6B is scaled by a factor of 0.75, 0.5 or 0.25; respectively, to modulate the brightness of the M-QPI imager pixel 230.

Figure 6C:
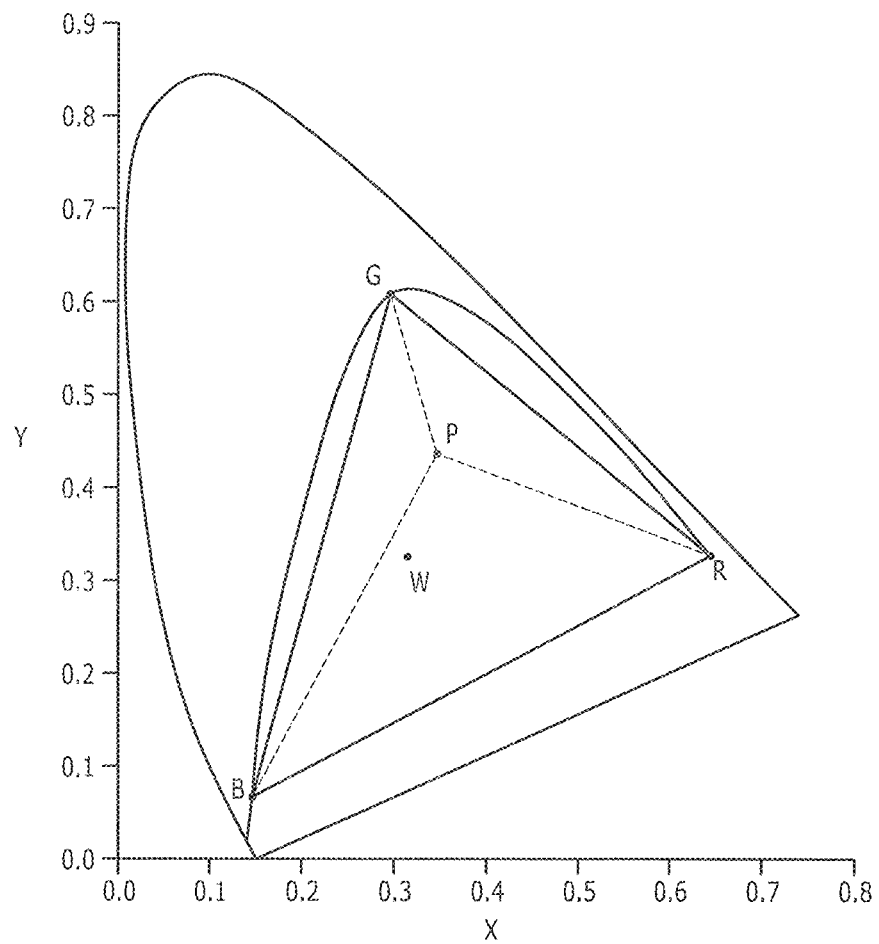
FIG. 6C illustrates an embodiment for modulating an arbitrary color point within the interior of the gamut of the pixels of the color-tunable Monolithic Quantum Photonic Imager device of this disclosure relative to the chromaticity coordinates of the pixel's spectral gamut RGB corners.

When the color (or chromaticity) to be modulated by an M-QPI imager pixel 230 lies at any point P within the interior gamut of the pixels' 230 spectral locus 610, that color can be modulated by selecting the pixel's 230 drive voltage levels ($v_R$, $v_G$, $v_B$) of the spectral gamut RGB corners at their corresponding temporal multiplexing ratios ($\tau_R$, $\tau_G$, $\tau_B$), as illustrated in FIG. 6B, with these temporal multiplexing ratios being scaled by the normalized chromaticity distances of the pixel color P to be modulated relative to the chromaticity coordinates of the pixel's 230 spectral gamut RGB corners as illustrated in FIG. 6C.

The required brightness to be modulated for the M-QPI imager pixel 230 in this case is modulated by further scaling the resultant temporal multiplexing ratios of the spectral gamut RGB corners by the ratio of the brightness value to be modulated relative to the corresponding brightness values for the target white point. For example, if full brightness at that color point P is required to be modulated by the M-QPI imager pixel 230, then the full values of the resultant temporal multiplexing ratios of the spectral gamut RGB corners are used to modulate the brightness of the M-QPI imager pixel 230 at the modulated chromaticity. Similarly, if for example 0.75, 0.5 or 0.25 brightness at the modulated chromaticity is required to be modulated by the M-QPI imager pixel 230, then the full values of the resultant temporal multiplexing ratios of the spectral gamut RGB corners are further scaled by a factor of 0.75, 0.5 or 0.25; respectively, to modulate the brightness of the M-QPI imager pixel 230 at the modulated chromaticity.

Figure 6D:
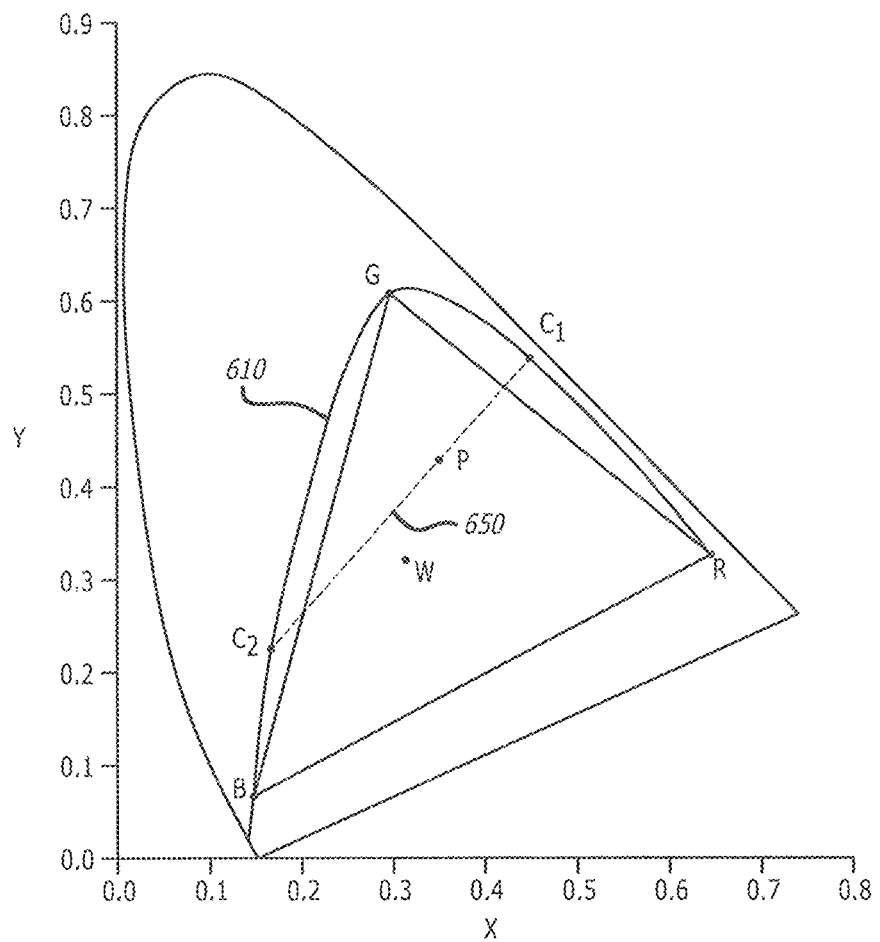
FIG. 6D illustrates an alternate embodiment for modulating an arbitrary color point within the interior of the gamut of the pixels of the color-tunable Monolithic Quantum Photonic Imager device of this disclosure relative to the chromaticity coordinates of the pixel's spectral gamut RGB corners.

In an alternate embodiment for modulating the color (or chromaticity) of an M-QPI imager pixel 230 that lies at any point P within the interior gamut of the pixels' 230 spectral locus 610, that color can be modulated by selecting the pixel's 230 drive voltage levels ($v_{c1}$, $v_{c2}$) corresponding to the color point pair ($c_1$, $c_2$), illustrated in FIG. 6D, along the pixels' 230 spectral locus 610 intersection with the gamut chord 650 at color point pair ($c_1$, $c_2$) corresponding temporal multiplexing ratios ($\tau_{c1}$, $\tau_{c2}$), as illustrated in FIG. 6B, with the temporal multiplexing ratios being scaled by the normalized chromaticity distances of the pixel color P to be modulated relative to the chromaticity coordinates of the two color points ($c_1$, $c_2$) as illustrated in FIG. 6D. The required brightness to be modulated for the M-QPI imager pixel 230 in this case is modulated by further scaling the resultant temporal multiplexing ratios of the two color points ($c_1$, $c_2$) by the ratio of the brightness value to be modulated relative to their corresponding brightness values for the target white point illustrated by curve 630 of FIG. 6B.

For example, if full brightness at color point P is required to be modulated by the M-QPI imager pixel 230, then the full values of the resultant temporal multiplexing ratios of the two color points ($c_1$, $c_2$) are used to modulate the brightness of the M-QPI imager pixel 230 at the modulated chromaticity. Similarly, if for example, 0.75, 0.5 or 0.25 brightness at the modulated chromaticity is required to be modulated by the M-QPI imager pixel 230, then the full values of the resultant temporal multiplexing ratios of the two color points ($c_1$, $c_2$) are further scaled by a factor of 0.75, 0.5 or 0.25; respectively, to modulate the brightness of the M-QPI imager pixel 230 at the modulated chromaticity.

Figure 6E:
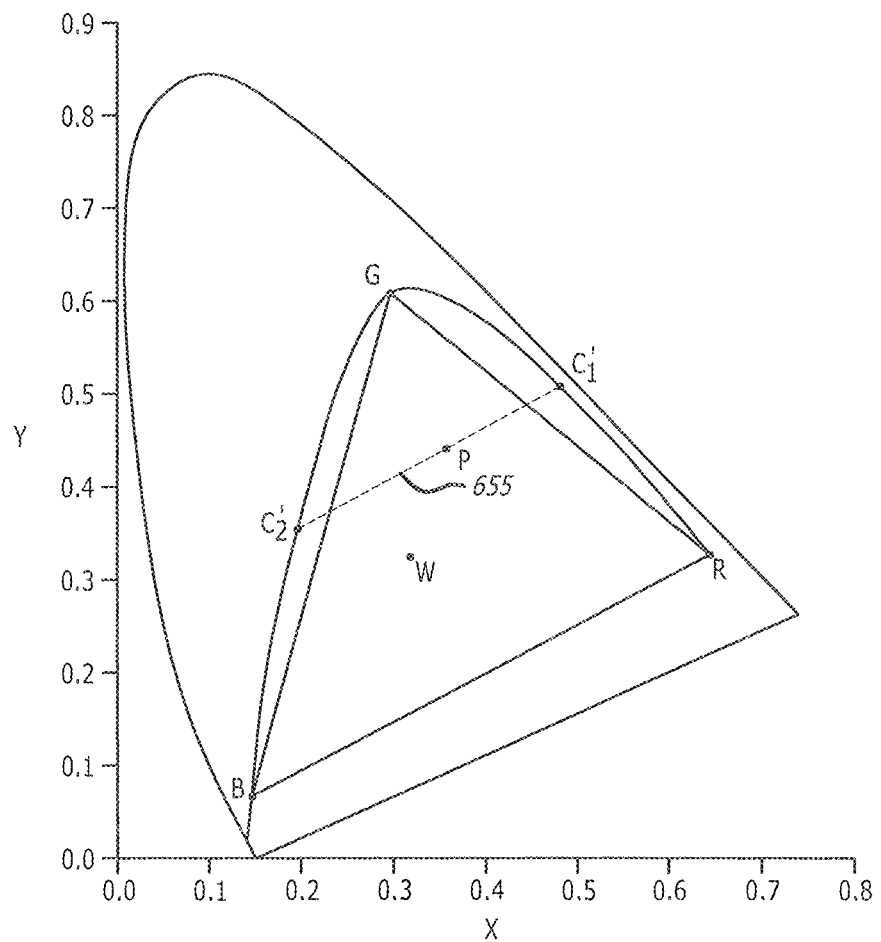
FIG. 6E illustrates a further alternative embodiment for modulating an arbitrary color point within the interior of the gamut of the pixels of the color-tunable Monolithic Quantum Photonic Imager device of this disclosure relative to the chromaticity coordinates of the pixel's spectral gamut RGB corners.

In an alternate embodiment for modulating the color (or chromaticity) of an M-QPI imager pixel 230 that lies at any point P within the interior gamut of the pixels' 230 spectral locus 610, that color can be modulated by selecting the pixel's 230 drive voltage levels ($v_{c'_1}$, $v_{c'_2}$) corresponding to the color point pair ($c'_1$, $c'_2$), illustrated in FIG. 6E, along the pixels' 230 spectral locus 610 intersection with the gamut minimum width chord 655 at the color point pair ($c'_1$, $c'_2$) corresponding temporal multiplexing ratios ($\tau_{c'_1}$, $\tau_{c'_2}$), as illustrated in FIG. 6B, with these temporal multiplexing ratios each being scaled by the normalized chromaticity distances of the pixel color P to be modulated relative to the chromaticity coordinates of the two color points ($c'_1$, $c'_2$) as illustrated in FIG. 6D.

The required brightness to be modulated for the M-QPI imager pixel 230 in this case is modulated by further scaling the resultant temporal multiplexing ratios of the two color points ($c'_1$, $c'_2$) by the ratio of the brightness value to be modulated relative to their corresponding brightness values for the target white point illustrated by curve 630 of FIG. 6-2. For example, if full brightness at color point P is required to be modulated by the M-QPI imager pixel 230, then the full values of the resultant temporal multiplexing ratios of the color point pair ($c'_1$, $c'_2$) are used to modulate the brightness of the M-QPI imager pixel 230 at the modulated chromaticity. Similarly, if for example 0.75, 0.5 or 0.25 brightness at the modulated chromaticity is required to be modulated by the M-QPI imager pixel 230, then the full values of the resultant temporal multiplexing ratios of the color point pair ($c'_1$, $c'_2$) are further scaled by a factor of 0.75, 0.5 or 0.25; respectively, to modulate the brightness of the M-QPI imager pixel 230 at the modulated chromaticity.

It is noted that in the embodiment in which the gamut RGB corners are used to modulate display point P at a required brightness, three pixels' drive voltage levels are required to be temporally multiplexed at the multiplexing ratios $\tau_R$, $\tau_G$ and $\tau_B$ as defined by curve 630 of FIG. 6B while in the latter two embodiments only two pixels' drive voltage levels are required to be temporally multiplexed at their corresponding multiplexing ratios $\tau_c$ in order to modulate display point P at the required brightness.

In the embodiment in which the pair of color points ($c'_1$, $c'_2$) defined by the intersection of the minimum width gamut chord 655 with the pixels' 230 spectral locus 610 are used to modulate the display point P at a required brightness, the position of the minimum width gamut chord 655 uniquely defines (i.e., identifies) the chromaticity coordinates of the color points ($c'_1$, $c'_2$). Therefore, in specifying the chromaticity of the display point P, it is sufficient to specify only the position of the minimum width gamut chord 655 within color gamut 610 that contains the display point P and chromaticity distance of the display point P to the chord ends color points ($c'_1$, $c'_2$) normalized relative to the chord width.

The normalized chord chromaticity distance specifies the position of the display point P within the gamut chord width relative to the color point pair ($c'_1$, $c'_2$) while the position of the minimum width gamut chord 655 within the color gamut 610 identifies the color point pair ($c'_1$, $c'_2$). Thus their corresponding pixel's 230 drive voltage levels ($v_{c'_1}$, $v_{c'_2}$) and also their corresponding temporal multiplexing ratios ($\tau_{c'_1}$, $\tau_{c'_2}$), which, when scaled by normalized chord chromaticity distance, produces the specified the chromaticity of the display point P. The specified brightness of the display point P is modulated by further scaling of the resultant temporal multiplexing ratios ($\tau_{c'_1}$, $\tau_{c'_2}$) by the ratio of the brightness value to be modulated relative to their corresponding brightness values for the target white point illustrated by curve 630 of FIG. 6B.

Input Data Conversion

In the previous embodiment, modulation of the color and brightness of the display color point P requires the specification of two chromaticity-related values and a brightness-related value. The first chromaticity value is the position of the color point P within the minimum width chord 655 while the second chromaticity value is the position of the minimum width gamut chord 655 within the pixels' 230 color gamut 610. The brightness-related value specifies the brightness of the display point P relative to the brightness of the display white point W. These chromaticity- and brightness-related values are extracted from the display input data which is typically specified for the display color point P also in terms of the two chromaticity coordinates values (x, y) and the brightness Y as in the case of CIE xyY color space standard, for example. The position of the minimum width gamut chord 655 within the pixels' 230 color gamut 610 is specified in terms of its position relative to the chromaticity distance of the main gamut chord, extending from the R to the B vertices of the gamut to the G vertex of the gamut.

Alternatively the chromaticity coordinates of the display color point P may be defined relative to two axes; one axis being the main gamut chord extending from the R to the B vertices of the gamut while the second axis being the line extending from the G vertex of the gamut and passing through the display white point W to intersect with the main gamut chord axis. Transformation of the input data format, which can be CIE xyY color space or RGB standards, for example, is through a color space conversion operation (processing block 461 of FIG. 4C) which transforms the input data to one of the color spaces of the this embodiment based on a set transformation matrix.

Gamut Control

The display gamut the M-QPI imager pixels 230 can be adjusted to either match a standard display gamut, such as NTSC or the HDTV gamut, or to dynamically adapt to the display gamut of the video frame input (U.S. Pat. Nos. 8,098,265 and 9,524,682). In either case, an additional time slot is added to the display pixels' 230 modulation frame that is dedicated to modulating the display white point W at a specified temporal multiplexing ratio. The temporal multiplexing of the white point W shifts the chromaticity of the color point c along the pixels' 230 spectral locus 610 being modulated towards the white point W by a ratio that equals to the temporal multiplexing ratio of the added white point W.

Adding the display white point W at a required ratio is accomplished by modulating the reciprocal gamut color point c' of the color point c at the appropriate temporal multiplexing ratio. This is performed such that the added ratio of the gamut color point c' in combination with a portion of the temporal multiplexing ratio of the color point c produces the ratio of white point W needed to shift the chromaticity of the color point c towards the white point W by the required amount. This, in turn causes each color point modulation period to be comprised of a given temporal mixing ratio of that spectral gamut color point c and its reciprocal gamut color point c' and enables the adjustment of the modulated color point c towards the white point W by an amount that is proportional the temporal mixing ratio of the two color points (c, c').

This color modulation method, which requires two corresponding voltage drive levels for the pixel's 230 ($v_c$, $v_{c'}$) for the pixel's 230, enables the adjustment of the chromaticity of the color point c along the pixels' 230 spectral locus 610 being modulated towards the white point W by a ratio that is proportional to the temporal multiplexing ratios of the two corresponding voltage drive levels ($v_a$, $v_{a'}$) of the pixel's 230. This chromaticity adjustment method enables adjustment of the gamut defined by the pixels' 230 spectral locus 610 to match a standard display gamut, such as NTSC or the HDTV gamut, for example. Similarly, using this chromaticity adjustment method allows the gamut defined by the pixels' 230 spectral locus 610 to be adapted dynamically on video frame-by-frame basis to match input video frame gamut. The latter method results in an increase in the display brightness as well as the ability to use a compressed input video format that makes use of shorter word length to express the chromaticity values of the modulated the display pixels' 230.

It is noted that the methods for controlling the color and brightness of a color-tunable semiconductor light emitting diode structure, such as 300, for example, outlined in the description of the forgoing embodiments, are applicable to any color-tunable semiconductor light emitting diode structure in which the color of the light emitted from light emitting diode structure is a function of its injection current.

Such a color-tunable semiconductor light emitting diode structure would typically incorporate multiple, at least two, active sub-regions whereby the carrier injection into each such active sub-region is a function of the carrier injection level, such that the luminous flux and chromaticity of the light emitted from the color-tunable semiconductor light emitting diode structure are injection current-dependent weighted sums of the luminous flux and chromaticity; respectively, of the light emitted from each of the structure's active sub-regions.

In the forgoing detailed description, the present disclosure has been described with reference to specific embodiments thereof. It will, however, be evident that various modifications and changes can be made thereto without departing from the broader spirit and scope of the disclosure. The design details and drawings are, accordingly, to be regarded in an illustrative rather than a restrictive sense. Skilled persons will recognize that portions of this disclosure may be implemented differently than the implementation described above for the embodiment.

For example, skilled persons will appreciate that the M-QPI imager 200 pixels 230 of this disclosure can be implemented with numerous variations to the number of active sub-region layers 330 comprising the photonic semiconductor structure 210, the specific design details of the multilayer color-tunable light emitting diode structure 300, the specific design details of the pixels' 230, the specific details of the semiconductor fabrication procedures the M-QPI imager 200, and the specific design details of the digital control and processing required for coupling the image data input to the M-QPI imager 200. Skilled persons will further recognize that many changes may be made to the details of the aforementioned embodiments of this disclosure without departing from the underlying principles and teachings thereof. The scope of the present disclosure should, therefore, be determined only by the following claims.

What is claimed is:

1. A solid state imager comprising:
   an array of digitally addressable multicolor micro pixels wherein each pixel structure comprises an emissive monolithic color-tunable semiconductor light emitting diode or structure comprising a single photonic layer,
   wherein the micro pixels' respective color and brightness values are modulated by controlling a charge carrier injection drive current level and/or an on/off duty cycle of the respective color-tunable semiconductor light emitting diode or structure,
   wherein each micro pixel is individually addressable to enable the pixel to emit a user-defined set of colors associated with its respective monolithic color-tunable semiconductor light emitting diode or structure at a user-defined brightness or predetermined on/off duty cycle for the emitted color,
   wherein each of the micro pixels' diodes or structures comprises a uniquely addressable electrical contact and a common metal contact, wherein the common metal contact is shared among all or a plurality of the array of pixels.

2. The solid state imager of claim 1, wherein each micro pixel structure comprises a micro optical cavity that comprises the pixels' monolithic color-tunable semiconductor light emitting diode or structure,
   wherein the light generated by the micro pixels is emitted perpendicularly to a plane of the solid state imager,
   wherein the light generated by the micro pixels is emitted perpendicularly to a plane of the imager via a plurality of vertical waveguides configured to extract and collimate the light generated from the pixel,
   wherein the micro pixel structure further comprises a pixel-level micro optical element configured to further collimate and directionally modulate the light emitted from the micro pixels.

3. The solid state imager of claim 2 wherein the pixels' monolithic color-tunable light emitting diodes or structures are optically and electrically separated by sidewalls comprised of an insulating semiconductor material and a reflective metal cladding,
   wherein the pixels' metal contact is reflective and together with said pixels' reflective sidewalls defining the pixels' optical micro cavity,
   wherein the pixels' sidewalls reflective metal cladding are used as an electrical interconnect that routes the drive current to the pixels' monolithic color-tunable light emitting diodes or structures.

4. The solid state imager of claim 1 wherein the imager is electrically coupled to a control drive logic circuit that routes and generates electrical signals that independently control the light emission of the pixels' monolithic color-tunable semiconductor light emitting diode or structure,
- wherein the control drive logic circuit is comprised of a plurality of control drive logics that defines a control drive logic array that is bonded to the array of pixels of claim 1,
- wherein the pixel array and their associated control drive logic array are both within an optical aperture edge of the imager,
- wherein the imager's control drive logic circuit external electrical interfaces are created as through silicon via array at the backside of the control drive logic circuit.

5. The solid state imager of claim 2 wherein the array of emissive monolithic color-tunable pixels are configured to either directly emit substantially Lambertian light from a pixel's top surface, or to emit a quasi-Lambertian light from a plurality of waveguides,
- whereby the pixels' quasi-Lambertian light emission parameters are set forth by selecting the pixels' multiplicity of waveguides depth, diameter and pattern across the pixel's emissive aperture,
- whereby the pixels' multiplicity of waveguides depth, diameter and pattern across the pixel's emissive aperture are selected to collimate the light emission from the pixels.

6. The solid state imager of claim 1 further comprising an aperture micro optical element or lens configured to further collimate or directionally modulate the light emission from the pixels,
- wherein the micro pixels' aperture micro optical elements or lens directional modulation are selected to further configure the pixels' array light emission into either a telecentric or a non-telecentric light emission pattern.

7. The solid state imager of claim 1 further comprising a photonic light emitting semiconductor structure and a digital semiconductor structure, the photonic light emitting semiconductor structure comprised of a plurality of emissive color-tunable semiconductor light emitting micro pixels, the digital semiconductor structure comprised of digital drive logic circuits configured to provide power and control signals to the plurality of micro pixels of the photonic semiconductor structure wherein the digital semiconductor structure comprises a topside contacts layer that couples an electrical drive signal to the individual pixels of the pixel array and a backside contacts layer that couples an external electrical drive signal into the solid state imager.

8. The solid state imager of claim 7 wherein the photonic light emitting semiconductor layer and the digital semiconductor structure are bonded together by a bonding layer and an emissive top side of the imager is encapsulated with a transparent cover layer bonded to the imager.

9. The solid state imager of claim 7 wherein the digital semiconductor structure surface area is larger in surface area than the emissive pixel array area.

10. The solid state imager of claim 7 wherein the photonic light emitting semiconductor layer has a surface area substantially equal to a surface area of the digital semiconductor structure and comprises a micro ball grid array disposed on a back surface of the imager to couple external electrical signals into the imager.

11. The solid state imager of claim 10 wherein the photonic light emitting semiconductor layer has a surface area substantially equal to a surface area of the digital semiconductor structure and comprises an array of through silicon vias to couple the imager external electrical drive signals from the micro ball grid array to the digital semiconductor structure through silicon via array.

12. The solid state imager of claim 1 wherein a pixel pitch is equal to or larger than 5 microns.

13. A method for fabricating a solid state imager, comprising the steps of:
- fabricating a first wafer comprising an array of digitally addressable multicolor micro pixels wherein each pixel comprises an emissive micro optical cavity comprising a monolithic color-tunable semiconductor light emitting diode or structure comprising a single photonic layer;
- whereby the pixels' respective color and brightness values are modulated by controlling a charge carrier injection drive current level and/or an on/off duty cycle of the respective color-tunable semiconductor light emitting diode or structure;
- fabricating a digital semiconductor structure comprising at least one digital drive logic circuit on a separate second wafer;
- bonding the first wafer to the second wafer to electrically couple the color tunable semiconductor light emitting diode or structure to the digital drive logic circuit.

14. The solid state imager of claim 1 wherein the monolithic color-tunable semiconductor light emitting diode is comprised of a III-V material structure comprising a multiplicity of layers grown epitaxially to form a single junction diode comprising an optically active region interposed between two oppositely doped peripheral regions,
- whereby the monolithic color-tunable semiconductor light emitting diode optically active region is further comprised of multiplicity of optically active sub-regions,
- whereby the multiplicity of optically active sub-regions each comprising at least one quantum confinement structure comprising a quantum confinement layer interposed between two barrier layers,
- whereby the monolithic color-tunable semiconductor light emitting diode optically active region further comprising a multiplicity of charge carriers intermediate blocking layers,
- whereby the multiplicity of charge carriers intermediate blocking layers are interposed between the optically active sub-regions.

15. The solid state imager of claim 14, wherein the intermediate blocking layers each are having band-gap energy at least greater than the intrinsic band-gap of the active region as well as the band-gap of the diode junction doped peripheral regions.

16. The solid state imager of claim 14, wherein the intermediate blocking layers each having a band-gap as affected by their material composition that differs in value depending on its position within the optically active region.

17. The solid state imager of claim 14, wherein the intermediate blocking layers each having a band-gap offset relative to the intrinsic band-gap of the optically active region as affected by their doping level and doping polarity,
- whereby intermediate blocking layers is doped positive (P-doped), not doped or doped negative (N-doped),
- whereby each of the intermediate blocking layers band-gap is offset relative to the intrinsic band-gap of the optically active region either toward the conduction band or toward the valence band in proportion with their selected doping level and doping polarity,
- wherein the intermediate blocking layers band-gaps and band-gaps offsets level are differently selected amongst the multiplicity intermediate blocking layers to affect a specified charge carrier injection distribution profile amongst the multiplicity of the active sub-regions.

18. The solid state imager of claim 14, wherein the intermediate blocking layers have band-gap energy and band-gap offset level being user-selected to enable a specified current dependent (selective) charge carrier injection distribution profile amongst the multiplicity of the active sub-regions, and consequently a correspondingly specified current dependent light emission intensity distribution profile from the multiplicity of optically active sub-regions.

19. The solid state imager of claim 18, wherein the user-selected band-gap energy and band-gap offset level of the intermediate blocking layers subsequently enable user-selected current dependent light emission intensity from the optically active region that is a weighted sum of the light emission intensity of the multiplicity of the active sub-regions,
    wherein each weighting factor represents the proportion of light emission intensity of its respective optically active sub-regions relative to the total light emission intensity of the entire optically active region,
    wherein the value of each of the weighting factors being current dependent, by action of specifically selecting the intermediate blocking layers band-gaps and band-gaps offset levels, to enable the multiplicity of current dependent weighting factors to create a current dependent light emission intensity from the optically active region.

20. The solid state imager of claim 19, wherein the band-gaps of the quantum confinement layers of each optically active sub-region is equal while of the multiplicity of active sub-regions each having a different band-gap value to enable different light emission wavelength from each of the multiplicity of the active sub-regions of the active region,
    wherein by action of the current dependent weighted sum of light emission intensity of the multiplicity of the active sub-region, the proportionally current dependent weighed sum of the different wavelength light emission from the multiplicity of the active sub-regions produces a correspondingly current dependent chromaticity (color) of the light emission from the active region light emission.

21. The solid state imager of claim 19 or claim 20, wherein the current dependent light emission intensity and chromaticity enabled by the user-selected action of the intermediate blocking layer band-gaps and band-gap offset values creates a corresponding current dependent light emission spectral locus from the monolithic color-tunable semiconductor light emitting diode,
    wherein at low current injection level the light intensity and chromaticity corresponding to the current dependent weighting factors corresponding with the optically active sub-region adjacent to the P-doped side of the diode dominates the diode light emission,
    wherein at high current injection level the light intensity and chromaticity corresponding to the current dependent weighting factors corresponding with the optically active sub-region adjacent to the N-doped side of the diode dominates the diode light emission,
    wherein at mid-range of current injection level the light intensity and chromaticity corresponding to the current dependent weighting factors corresponding with the mid active region optically active sub-region of the diode dominates the diode light emission,
    wherein current injection level spanning the range from low to high levels systematically corresponds to the respective current dependent weighting factors of the multiplicity of sub-active regions to enable light emission intensity and chromaticity that spans the spectral locus the light emission of the optically active region of the monolithic color-tunable semiconductor light emitting diode.

22. The solid state imager of claim 21, wherein the current dependent spectral locus light emission of the optically active region of the monolithic color-tunable semiconductor light emitting diode enabling the current dependent spectral locus light emission of the diode that spans (covers) the spectral color gamut extending across the color-coordinates vertices corresponds to the emission wavelengths of its respective active sub-regions,
    whereby full coverage of a user specified current dependent light emission color gamut is enabled by the selecting the number of the quantum confinement structures included by design within each of the active sub-regions of diode active region.

23. The solid state imager of claim 14, wherein the material system of the monolithic color-tunable semiconductor light emitting diode is selected to enable user specified current dependent light emission having color gamut spectral coverage within the visible light spectrum,
    wherein the material system is comprised of a InGaAlN material,
    wherein the visible spectrum light emission color gamut being used in display systems including NTSC, HD-TV or extended color gamut displays.

24. The solid state imager of claim 14, wherein each pixel structure comprises the monolithic color-tunable semiconductor light emitting diode and wherein each pixel is connected to digital drive logic circuits that provide color and brightness electrical control signals to each pixel periodically within a specified color and brightness modulation period,
    wherein the color and brightness electrical control signals are provided to each pixel within the modulation period as continuous waveform signal,
    wherein the color and brightness electrical control signals are provided to each pixel within the modulation period as a sequence of pulsed waveform signals,
    wherein whether continuous or pulsed time, the color and brightness control signal specifies the voltage (or equivalently the current) level at which the pixel is driven during the modulation period to affect the pixel light emission of a selected color and brightness along the pixel's diode spectral locus during that period.

25. The solid state imager of claim 24, wherein the modulation of color points within the interior of the color gamut defined by the pixels' spectral locus of the multicolor pixel at a specified brightness is enabled by driving the digitally addressable multicolor pixel using multiple pulsed signals within the duration of the pixel's modulation period,
    wherein each of the multiple pulsed signals within the duration of the pixel's modulation period are modulated using multiple the voltage (or equivalently the current) levels that each corresponds to specified set of pixel's spectral locus positions.

26. The solid state imager of claim 25, wherein the multiple voltage levels being used to drive the pulsed signals within the pixel's modulation period being corresponding to the pixel's spectral locus positions of the pixel's gamut color-coordinates vertices defined by the emission wavelengths of the pixels' diode's respective optically active sub-regions.

27. The solid state imager of claim 26, wherein the selection of the multiple voltage levels used to drive the pulsed signals within the pixel's modulation period corresponds to at least one of the emission wavelengths of the pixel's respective optically active sub-regions.

28. The solid state imager of claim 25, wherein the multiple voltage levels being used to drive the pulsed signals within the pixel's modulation period being corresponding to at least two of the pixel's spectral locus positions that define a spectral chord across of the pixel's color gamut.

29. The solid state imager of claim 25, or claim 26, or claim 27 or claim 28, wherein the multiple pulsed signals being modulated, at a specified voltage level corresponding to a specified pixel's spectral locus position, multiple times at a specified duty cycle within the pixel's modulation period to enable modulation of a specified brightness level of the pixel within the modulation period at the chromaticity defined by the specified voltage level corresponding pixel's spectral locus position.

30. The solid state imager of claim 29, wherein the multiple pulsed signals each are being modulated, at a specified voltage level corresponding to a specified pixel's spectral locus positions, multiple times at a specified duty cycle within the pixel's modulation period to enable modulation of a specified display white point chromaticity at a specified brightness level of the pixel's light emission within the modulation period.

31. The solid state imager of claim 30, wherein the display white point duty cycle being used as a scale factor for the modulation duty cycles to enable modulation of a specified chromaticity and brightness of the pixel within the modulation period that are commensurate with the specified display white point chromaticity and brightness level.

32. The solid state imager of claim 31, wherein the display white point scaled pixel's modulation duty factors each being used to enable modulation of the pixel's specified chromaticity and brightness within the pixel's modulation period that are commensurate with the specified display white point chromaticity and brightness level.

33. The solid state imager of claim 32, wherein a specified chromaticity of a target pixel's with specified chromaticity coordinates located within the interior of gamut formed by the pixel's spectral locus being modulated by temporally multiplexing the multiple pulsed voltage signals within the pixel modulation period at their display white point scaled modulation duty factors values then further their duty factors being scaled by the relative ratios of their chromaticity distances from the target pixel's specified chromaticity coordinates.

34. The solid state imager of claim 33, wherein a specified brightness of the target pixel being modulated by further scaling the duty factors of the temporally multiplexed multiple pulsed voltage signals within the pixel modulation period by the ratio of the specified brightness value of the target pixel to the corresponding brightness values of the display white point duty factors.

* * * * *